(12) United States Patent
Marnissi et al.

(10) Patent No.: US 11,754,435 B2
(45) Date of Patent: Sep. 12, 2023

(54) METHOD, DEVICE AND COMPUTER PROGRAM FOR MONITORING A ROTATING MACHINE OF AN AIRCRAFT

(71) Applicant: SAFRAN, Paris (FR)

(72) Inventors: Yosra Marnissi, Moissy-Cramayel (FR); Dany Abboud, Moissy-Cramayel (FR); Mohammed El Badaoui, Moissy-Cramayel (FR)

(73) Assignee: SAFRAN, Paris (FR)

( * ) Notice: Subject to any disclaimer, the term of this patent is extended or adjusted under 35 U.S.C. 154(b) by 0 days.

(21) Appl. No.: 17/774,591

(22) PCT Filed: Nov. 3, 2020

(86) PCT No.: PCT/FR2020/051978
§ 371 (c)(1),
(2) Date: May 5, 2022

(87) PCT Pub. No.: WO2021/089936
PCT Pub. Date: May 14, 2021

(65) Prior Publication Data
US 2022/0412793 A1  Dec. 29, 2022

(30) Foreign Application Priority Data
Nov. 5, 2019  (FR) ...................... 1912377

(51) Int. Cl.
*G01H 1/00*  (2006.01)
*G01M 13/045*  (2019.01)

(52) U.S. Cl.
CPC .......... *G01H 1/006* (2013.01); *G01M 13/045* (2013.01)

(58) Field of Classification Search
None
See application file for complete search history.

(56) References Cited

U.S. PATENT DOCUMENTS 3,307,408 A   3/1967  Thomas et al.
3,501,965 A   3/1970  Morrow
(Continued)

FOREIGN PATENT DOCUMENTS

CN   104316323 A   1/2015
CN   105512369 A   4/2016
(Continued)

OTHER PUBLICATIONS

Guo et al., "Noise Removal in Vold-Kalman Order Tracking Based on Independent Component Analysis", Automation and Logistics, 2008. ICAL 2008. IEEE International Conference on, IEEE, Piscataway, NJ, USA, (20080901), ISBN 978-1-4244-2502-0, pp. 574-579, XP031329708 [A] 1-14.
(Continued)

*Primary Examiner* — Raul J Rios Russo
*Assistant Examiner* — Carl F. R. Tchatchouang
(74) *Attorney, Agent, or Firm* — Birch, Stewart, Kolasch & Birch, LLP

(57) ABSTRACT

The invention relates to a method (1) for monitoring a rotating machine (100) of an aircraft, wherein a measurement signal is acquired from the rotating machine. According to the invention, instantaneous frequencies ($f_K(t)$) of sinusoidal components of the measurement signal are estimated, and, using a computing module (12), a plurality of successive iterations are carried out in each of which: complex envelopes of the components are updated (C1), parameters of a model of a noise of the signal are updated (C21) on the basis of the envelopes, whether the model has converged from the preceding iteration to the present iteration is tested (C4), with a view to: o if not, carrying out a new iteration, o if so, performing a computation (D) of the complex envelopes on the basis of the iterations that have been carried out.

14 Claims, 7 Drawing Sheets

(56) References Cited

U.S. PATENT DOCUMENTS

Figure 1:
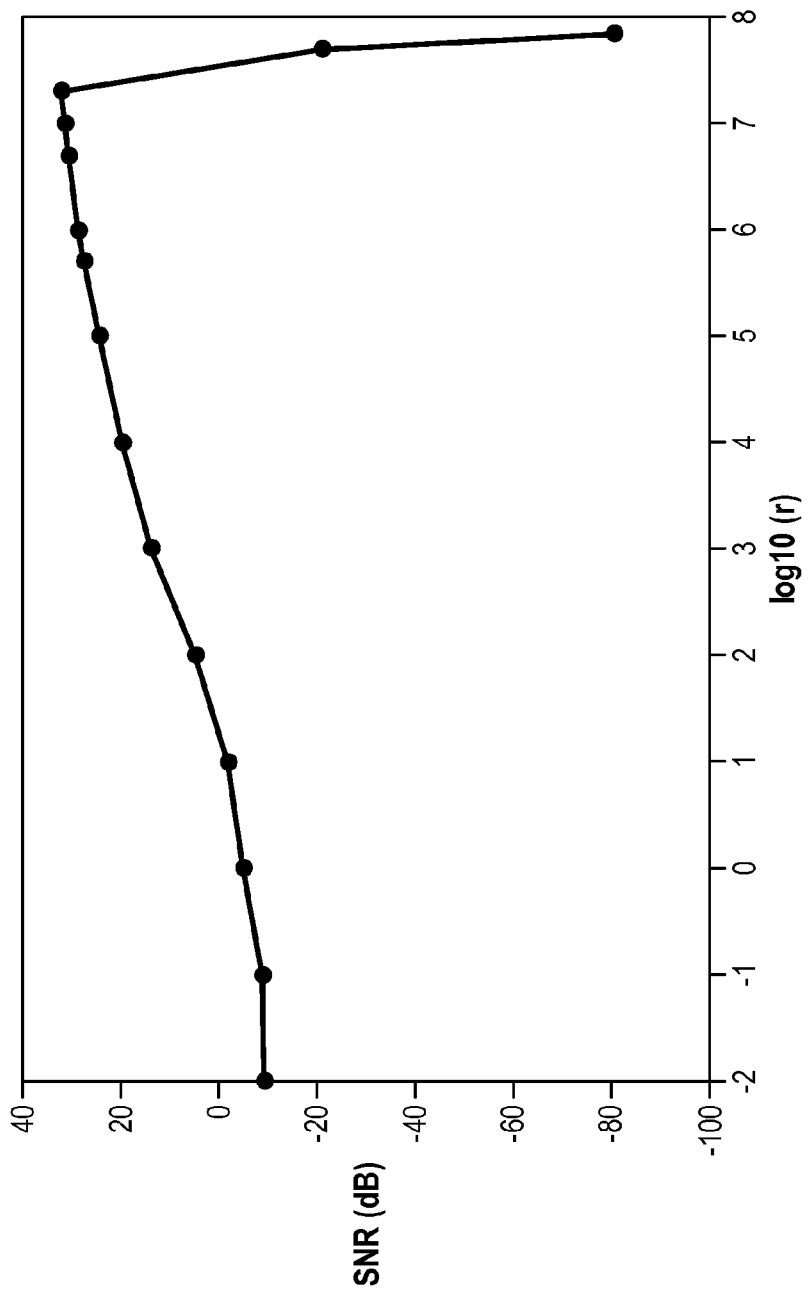

| | | | |
|---|---|---|---|
| 3,938,394 | A | 2/1976 | Morrow et al. |
| 2004/0125893 | A1 | 7/2004 | Gazor |
| 2009/0193900 | A1 | 8/2009 | Janssens et al. |
| 2010/0288051 | A9 | 11/2010 | Janssens et al. |
| 2015/0090036 | A1 | 4/2015 | Vold et al. |
| 2021/0080352 | A1 | 3/2021 | Abboud et al. |

FOREIGN PATENT DOCUMENTS

| | | | |
|---|---|---|---|
| CN | 107300467 A | 10/2017 | |
| FR | 2947335 A1 * | 12/2010 | ............. G01H 1/003 |

OTHER PUBLICATIONS

Hong et al., "Application of Spectral kurtosis and Vold-Kalman Filter Based Order Tracking in wind turbine gearbox fault diagnosis", 2017 9th International Conference on Modelling, Identification and Control (ICMIC), IEEE, (20170710), doi:10.1109/ICMIC.2017.8321698, pp. 49-53, XP033332362 [A] 1-14.

Jiri Tuma, "Setting the passband width in the Vold-Kalman order tracking filter", In Twelfth International Conference on Sound and Vibration (ICSV12), (Jul. 2005), Lisbon, Portugal, July (pp. 11-14).

Kandukuri et al., "Diagnostics of stator winding failures in wind turbine pitch motors using Vold-Kalman filter", IECON 2019—45th Annual Conference of the IEEE Industrial Electronics Society, IEEE, (20191014), vol. 1, doi:10.1109/IECON.2019.8926983, pp. 5992-5997, XP033669821 [A] 1-14.

Pan et al., "Adaptive Angular-Displacement Vold-Kalman Order Tracking", 2007 IEEE International Conference on Acoustics, Speech, and Signal Processing Apr. 15-20, 2007 Honolulu, HI, USA, IEEE, Piscataway, NJ, USA, (20070415), ISBN 978-1-4244-0727-9, pages III-1293, XP031463714 [A] 1-14.

Pan et al., "Adaptive Vold-Kalman filtering order tracking", Mechanical Systems and Signal Processing, Elsevier, Amsterdam, NL, (20070928), vol. 21, No. 8, doi:10.1016/J.YMSSP.2007.06.002, ISSN 0888-3270, pp. 2957-2969, XP022277316 [A] 1-14.

Vold et al., "Theoretical Foundations for High Performance Order Tracking with the Vold-Kalman Tracking Filter", SAE Technical Paper, No. 972007, 1997, pp. 1083-1088.

* cited by examiner

Initial spectrogram

Estimated envelope

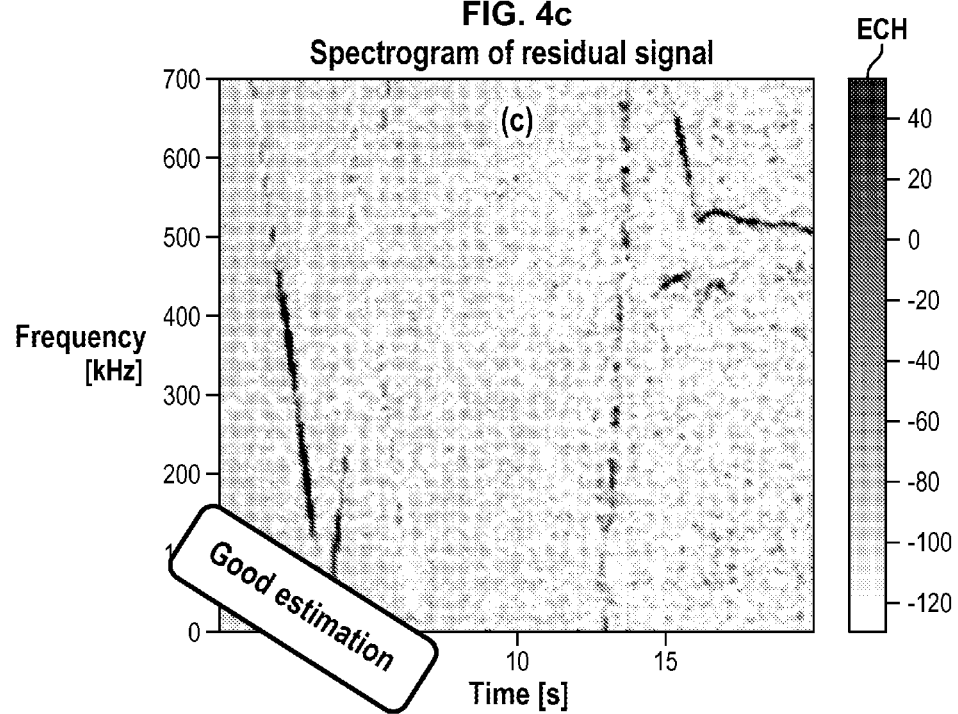
FIG. 4c Spectrogram of residual signal
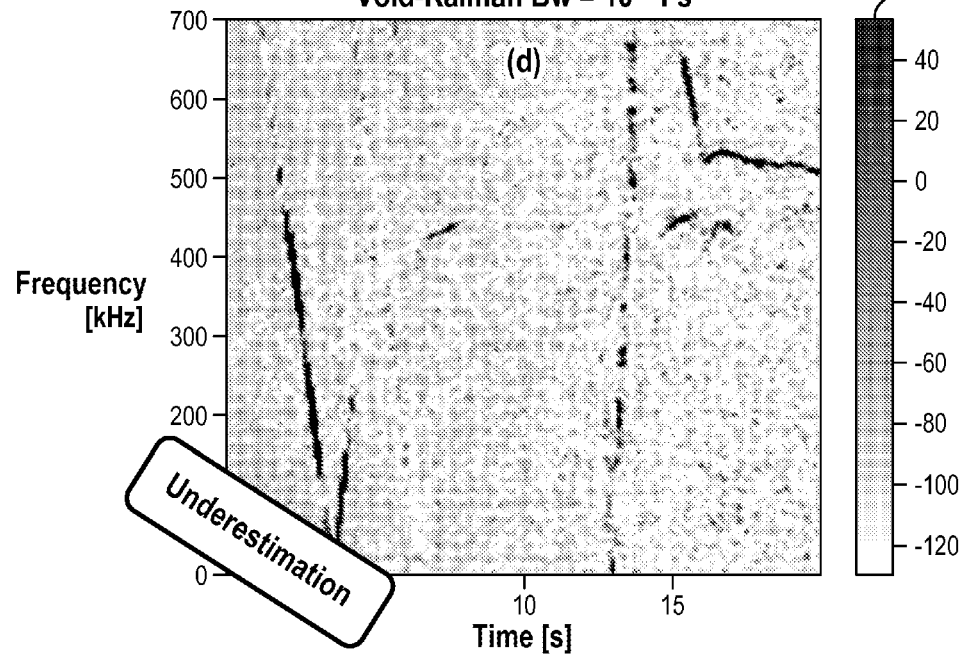
FIG. 4d Vold-Kalman Bw = $10^{-5}$ Fs

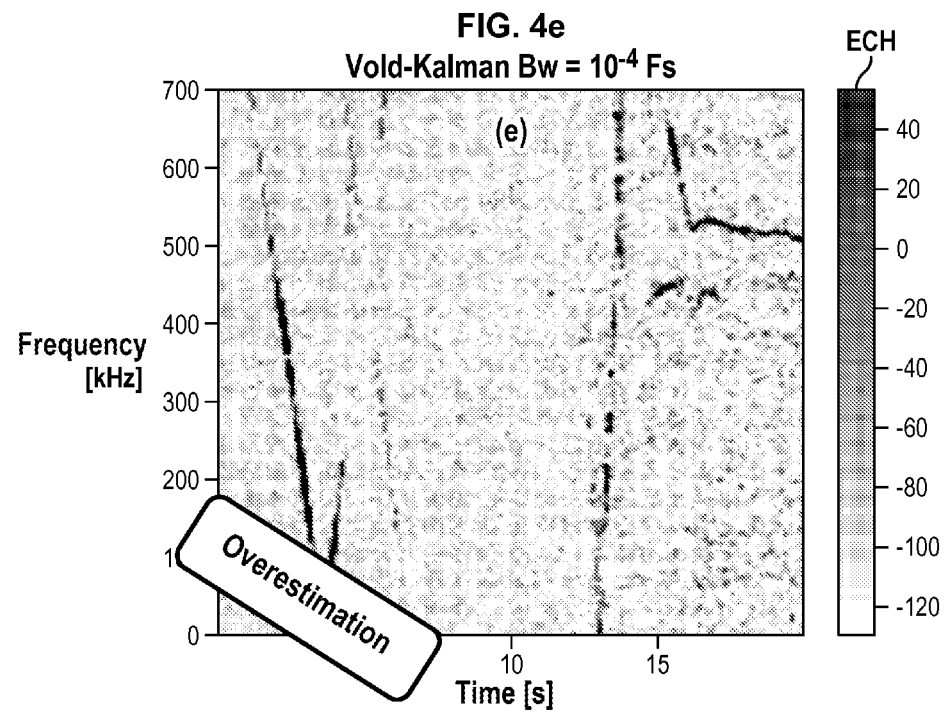
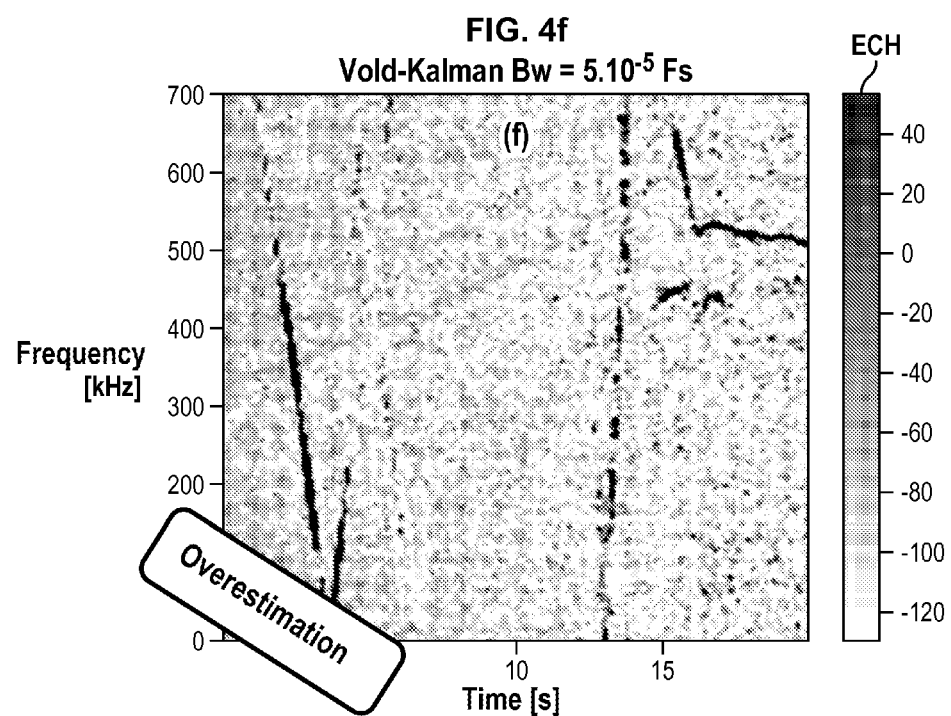

METHOD, DEVICE AND COMPUTER PROGRAM FOR MONITORING A ROTATING MACHINE OF AN AIRCRAFT

The invention relates to a method, a device and a computer program for monitoring at least one rotating machine of an aircraft. In particular, it can be a rotating machine for propulsion of the aircraft.

The invention relates to the field of monitoring rotating machines by analysis of vibratory signals. Elements in rotation produce mechanical vibrations which can result from imbalance, eccentricity of mass, worn bearings, twisted shafts, misaligned shafts, or similar. The consequence of manifestations of imbalance is to create vibrations of cyclic character whereof the periodicity depends on the component and the phenomenon affected. For example, a defect in imbalance of a rotor generates a purely sinusoidal component the instantaneous frequency of which is equal to that of the rotation and amplitude proportional to the square of the speed of rotation. Another example is the defect in parallel alignment of a shaft consequently generating sinusoidal vibration at a frequency double that of the shaft. Such defects, and others, can cause reduction in the service life of the components of the rotating machine or untimely stopping of the mechanical system in the event of damage (for example if the shaft is broken). These defects can also affect other elements of the system. For example, a defect in alignment causes premature wear of bearings, joints, shafts and couplings in the kinematic chain.

For these reasons, it is often necessary to control these defects by monitoring the vibratory signal. The operator is often interested in evaluating the level of imbalance or poor alignment of the shaft during a run-up (from 0 speed to operating speed) and also in a drop on speed. It is also preferable to know if the rotor passes through one or more resonances from its start-up to its normal operating speed. A tracking filter can ensure this function by calculating the amplitude and phase of a sinusoidal component of interest during a run-up and a shut-down. A tracking filter is equivalent to a very narrowband filter whereof the central frequency follows the frequency in rotation of the component of interest. The latter is often proportional to the rotation frequency of the engine shaft.

For example, if the operator wants to control the alignment of a rotor of a rotating machine, a tracking filter with a central frequency equal to twice the rotation frequency of the shaft can be applied to extract the component of interest. The amplitude and the instantaneous phase of this component are valuable diagnostic indicators. The amplitude can indicate the level and the severity of the alignment defect (in some cases this can be tolerable) or the existence of resonance. On the other hand, a sudden change in phase may indicate passing through a resonance.

The first tracking filters were implemented by analogue electrical circuits, such as in U.S. Pat. Nos. 3,307,408A and 3,938,394A. The problems of analogue filters are the complexity of electrical circuits which often need considerable power consumption. For this, digital filters are preferred today. A tracking filter known and used widely in the field of rotating machines is the Vold-Kalman filter. The design of this filter is based on a physical model given to the vibratory signal. In fact, vibratory signals originating from rotating mechanical members can be modelled as a sum of harmonic components embedded in supplementary noise. Each component can be shown as a signal modulated in phase and amplitude by a low-frequency basis. Slow modulations in amplitude and phase are physically connected to the fact that a change in speed of the machine has the effect of exciting different regions of the transfer function of the system. This results in a change in gain and phase accompanied by the change in speed. The analytical expression of this known model is given by:

[Math. 1]

$$y(n) = \sum_k a_k(n)\exp(j\phi_k(n)) + \text{noise}(n) \quad (1)$$

[Math. 2]

$$\begin{cases} y(n)\text{:observed signal} \\ \phi_k(n)\text{:instantaneous phase} \\ a_k(n)\text{:complex envelope} \end{cases}$$

The instantaneous frequency $f_k(n)$ describes the variation in frequential content over time. It is equal to the derivative of the instantaneous phase according to the following equation:

$$f_k(n) = \frac{Fs}{2\pi}(\phi_k(n) - \phi_k(n-1)) \quad [\text{Math. 3}]$$

where Fs is the sampling frequency. It is important to note that the information of the amplitude and of the phase of the k-th component are respectively the amplitude and the phase of the associated envelope $a_k(n)$.

The Vold-Kalman method proposes estimating the complex envelopes $a_k(n)$ associated with the instantaneous frequencies $f_k(n)$ from two equations. The first is called the equation of data stipulating that each component to be tracked is equal to the signal observed with a supplementary error $\delta_k(n)$ which must be as minimal as possible:

[Math. 4]

$$y(n) - a_k(n)\exp(j\phi_k(n)) = \delta_k(n)$$

The Vold-Kalman method also needs information a priori on the component to be tracked, which will be integrated into the structural equation. The complex envelope to be estimated $a_k(n)$ is a low-frequency signal modulating the carrier $\exp(j\phi_k(n))$, implying a regular and smooth structure of the envelope. The basic idea behind the Vold-Kalman method is that of introducing local restrictions favouring this property. This leads to a second equation, called the structural equation, which profits from the discrete differences to act as a low pass filter:

[Math. 5]

$$\nabla^{p+1} a_k(n) = \varepsilon_k(n)$$

where $\nabla^p$ is the operator of difference in order p (p also designates the order of the filter) and $\varepsilon_k(n)$ is a term of error which must be minimised to ensure the regularity of the envelope. In general, the orders 1 and 2 are the most used and the structural equations from which they derive are then given respectively by:

[Math. 6]

$$(p=1): a_k(n-1) - 2a_k(n) + a_k(n+1) = \varepsilon_k(n)$$

[Math. 7]

$$(p=2): a_k(n-2) - 3a_k(n-1) + 3a_k(n) + a_k(n+1) = \varepsilon_k(n)$$

The selectivity of the filter increases for intersecting orders.

Given the structural equation and that of data, the estimator in terms of least squares of the complex envelope

[Math. 8]

$$a_k=[a_k(1),\ldots,a_k(N)]^T$$

is equivalent to minimising the norm

[Math. 9]

$$\ell_2^2$$

of the errors according to the following equation:

[Math. 10]

$$\min_{a_k}\|\delta_k\|^2+r_k\|\epsilon_k\|^2$$

where $$\delta_k=[\delta_k(1),\ldots,\delta_k(N)]^T,\quad \text{[Math. 11]}$$

$$\epsilon_k=[\epsilon_k(1),\ldots,\epsilon_k(N)]^T\quad \text{[Math. 12]}$$

and
$r_k$ are positive weights to be fixed by the operator to control the degree of regularity of the envelope. The solution to this problem is explicit and is given in matrix form for each component k by the following equation:

[Math. 13]

$$\widehat{a_k}=(I+D_k^TD_k)^{-1}C_k^Ty$$

with

[Math. 14]

$$y=[y(1),\ldots,y(N)]T$$

[Math. 15]

$$D_k=\sqrt{r_k}A_p,$$

where $A_p$ is the matrix of discrete differences of order p and $C_k$ is the diagonal matrix formed by the terms

[Math. 16]

$$\exp(j\phi_k(1)),\ldots,\exp(j\phi_k(N)).$$

A first possibility for estimating several components

[Math. 17]

$$a_1(n),\ldots,a_K(n)$$

would be to proceed sequentially and independently with estimation of each component, that is:

[Math. 18]

$$\forall k\in\{1,\ldots K\},\widehat{a_k}=(I+D_k^TD_k)^{-1}C_k^Ty$$

The latter is known as mono-component estimation.

A second possibility would be to jointly estimate these components. In this second case, the equation of data is given as:

[Math. 19]

$$y(n)-\sum_{k=1}^{K}a_k(n)\exp(j\phi_k(n))=\delta(n)$$

and the estimator in the sense of least squares of the vector of the complex envelopes

[Math. 20]

$$a=[a_1^T,\ldots,a_K^T]^T,$$

is the solution to the problem:

[Math. 21]

$$\min_a\|\delta\|^2+\sum_{k=1}^{K}r_k\|\epsilon_k\|^2$$

which is given in matrix form by:

[Math. 22]

$$\hat{a}=(C^TC+D^TD)^{-1}C^Ty$$

with

[Math. 23]

$$=[C_1,\ldots,C_K]$$

and
D is the block-diagonal matrix formed by the sub-matrices $D_1;\ldots;D_k$.

This estimation is multi-component.

However, neither of these two possibilities using the given Vold-Kalman method is satisfactory in the field of aeronautics.

There is a first problem not resolved by this known Vold-Kalman method, in the case of non-stationary and/or non-Gaussian noise. In fact, the Vold-Kalman method is optimal only assuming that the noise is Gaussian and stationary, which is not verified in aeronautics for two reasons:

Admittedly, aerodynamic noise can be approximated by Gaussian noise but it is far from being stationary, especially in flight.

In the engine there are several rotating members which generate periodic vibrations and can be modelled by sinusoidal models. The components not considered in the structural equation will act as noise adding to the aerodynamic noise and can distort estimation of the envelopes of interest above all in the presence of coupling between the components.

For these reasons, noise (which is what remains in the measured signal if the components of interest are subtracted), is composed of random noise of Gaussian type (stationary or not) and sinusoidal noise (residual interfering sinusoidal components which are not included in the model among the K components to be estimated). This sinusoidal noise is far from being Gaussian. Also, at variable speed (when the engine is rotating at a non-constant speed/charge), this sinusoidal noise is non-stationary.

To approach the assumption of Gaussian noise and attenuate artefacts at coupling instants, joint estimation (multi-component) of the signal of interest with all the other harmonics which intersect it or which are very close over a period of time is preferable. In fact, when the different interfering components are estimated jointly, the equation of data ensures that the total energy of the signal will be distributed between these components, and with the structural equation favouring the regularity of solutions, joint estimation best decouples the components the frequencies of which intersect.

Therefore, this first non-resolved problem creates several disadvantages:

The major disadvantage of multi-component estimation in the Vold-Kalman method is a higher calculation relative to mono-component estimation: the dimension of the matrix to be inverted is K times greater. Taking all vibrations into consideration, K is going to be substantial.

Most often, the operator is not interested in the results for estimating interfering components. These components are appropriately estimated to diminish the estimation artefacts of the components of interest.

The total number of sinusoidal components in the signal measured by the sensor is most often unknown.

To detect the presence of interfering components, the operator must perform an inspection of the spectrogram of a measured multi-component signal. Also, it can happen that the instantaneous frequencies of these interfering harmonics are unknown, requiring extra work in estimating these frequencies prior to proceeding with estimating by Vold-Kalman, which can be prohibitive in the event where there is a large number of interfering components.

To attenuate these artefacts, a large value of $r_k$ can be used, but this supposes that the coupling moments a priori are known, which is not the case in practice. Placing a high value of $r_k$ on the whole signal is not a reliable solution, as explained hereinbelow in reference to FIG. 4d, as that leads to underestimation of the amplitude of the envelope.

There is a second problem not resolved by this known Vold-Kalman method, relating to the difficulty of adjusting the parameter $r_k$. Known methods need manual adjusting of parameters $r_k$, or, as an equivalent, of the bandwidth associated with each sinusoid. The choice of these parameters $r_k$ significantly affects the results of estimation and therefore a good choice is required. The quality of the estimation is closely tied to the choice of parameter $r_k$. The parameter $r_k$ can be interpreted statistically as the ratio of variances of the two centred random Gaussian vectors $\delta_k$ and $\varepsilon_k$ respectively. It follows that the greater $r_k$ is, the smaller the variance of $\varepsilon_k$ and therefore the solution is increasingly influenced by the structural equation resulting from a very smooth envelope. This also means that the greater $r_k$ is, the narrower the bandwidth of the filter associated with the k-th frequency and therefore the greater the selectivity. The optimal value of $r_k$ depends on the signal level over noise. The greater the noise, the greater the need to use a large value of $r_k$ so the noise can be suppressed. However, adjusting this parameter $r_k$ remains difficult for several reasons:

If noise is non-stationary, as is the case of a rotating aircraft machine, especially for propulsion of the aircraft (the level of this noise can change in flight, for example), use of the same value of $r_k$ is not optimal.

The use of a very big value of $r_k$ can cause digital problems. In fact, the matricial product $D_k^T D_k$ gives a semi-defined positive matrix of which the maximal eigen value increases linearly with $r_k$. In mono-component estimation, the matrix $I+D_k^T D_k$ is a positive defined symmetrical matrix (and therefore invertible) the minimal eigen value of which is equal to 1. In multi-component estimation, $C^T C$ is a positive semi-defined matrix, so the minimal eigen value of $C^T C+ D^T D$ can be very low. Therefore the values of the weights $r_k$ must not exceed a certain limit, beyond which the matrix $I+D_k^T D_k$ (OU $C^T C+D^T D$) in the case of multi-component estimation) can become very badly conditioned, resulting in a problem of inversion and amplification of digital errors. FIG. 1 shows the evolution of the signal-to-noise ratio SNR of the component estimated in a noisy synthetic mono-component signal as a function of the selected value of the parameter $r=r_k$. It can be seen that beyond a certain limit of the parameter $r_k$ dependent on the order of the filter, this signal-to-noise ratio SNR of the estimated component drops sharply due to poor conditioning of the matrix to be inverted and that consequently the performance of the method is degraded.

The problem of adjusting the parameter $r_k$ is more difficult in the event of many harmonics (that is, K is large) are to be tracked. In fact, the value of $r_k$ does not depend only on the level of the noise but also on the statistics of the components to be estimated. In this way considering the same value for all the $r_k$ is generally not a reliable solution, given that the different components to be estimated can have different energy ranges and different variation rates. This problem can be encountered for example if the aim is to estimate components linked to the meshing of rotating cogged wheels in the rotating machine and the modulations. In fact, the modulations generally have low energy relative to the component linked to meshing.

Several defects in the rotating machine have an effect of generating sinusoidal components at known frequencies. The problem amounts to tracking this frequency and analysing its amplitude. In the event where there is no defect, the amplitude should be low, but poor adjusting of the Vold-Kalman method can produce a dummy component whereof the amplitude is equal to the smoothed background noise, which can cause errors in diagnosis. Comparison of the amplitude estimated with the background noise can resolve the presence of these false positives. But this presupposes that the noise is known.

Given these observations, it appears that the problem of adjusting the parameters $r_k$ is not obvious to resolve and can affect the quality of the filtering, which consequently compromises the efficacy of the Vold-Kalman method.

The invention aims to provide a method, a device and a computer program for monitoring at least one rotating machine of an aircraft, which resolves both the abovementioned problems for coupling components and adjusting the parameter of the Vold-Kalman method.

For this purpose, a first subject matter of the invention is a monitoring method of at least one rotating machine of an aircraft, a method in which at least one measurement signal of the rotating machine is acquired by an acquisition module, characterised in that instantaneous frequencies of sinusoidal components of the measurement signal are estimated by an estimation module, several successive iterations are executed by a calculation module, in each of which:

complex envelopes of the sinusoidal components are updated, parameters of a noise model of the measurement signal are updated from the updated complex envelopes, a convergence test is performed as to whether the model converges from the preceding iteration to the current iteration, to:

in the negative, redo a new iteration, in the affirmative, perform a calculation of the complex envelopes from the iterations carried out.

The invention offers the possibility especially of resolving the second abovementioned problem of adjusting the parameter of the Vold-Kalman method. The invention allows automating of the estimation problem, and generalising to non-stationary interferences in particular the coupling of components and the non-stationarity of aerodynamic noise.

The invention therefore provides a method and a device for extraction or monitoring of one or more sinusoidal vibratory components having a variable instantaneous speed. By comparison with the Vold-Kalman method, the invention differs by way of the following advantages:

The problem is formulated probabilistically. The outlets of the method are no longer specific estimators but laws describing possible solutions, which makes it possible to have not only specific estimators but also quantification of the confidence in the estimation.

The invention allows automation of the estimation by calculating some $r_k$. jointly with the envelopes of the estimators. This avoids adjusting manually or heuristically of the parameter by the operators, and maximises the efficacy of the filtering.

According to an embodiment of the invention, all the unknown variables of the problem: the complex envelopes, the parameters of the noise model, the regularisation parameters, are estimated from their conditional laws a posteriori given the measurements. The parameters of these laws a posteriori are calculated by the calculation module at each iteration. As is known to the skilled person in general, a law a priori is defined by the fact that it is selected by the user so as to incorporate the preferred characteristics of the planned solution. As is known to the skilled person in general, a law a posteriori is defined by the fact that it takes observations into account.

According to an embodiment of the invention, said calculation of the complex envelopes in said affirmative is performed from the average of the law estimated.

According to an embodiment of the invention, the noise model of the measurement signal comprises a structured interfering noise, whereof the distribution of probability a priori of its spectrum has a heavy-tailed law calculated by the calculation module at each iteration. Therefore, according to an embodiment of the invention, the noise model of the measurement signal comprises a structured interfering noise, whereof the distribution of probability of its Fourier transform belongs to the class of heavier-tailed distributions than the normal law. This favours parsimony of the structured sinusoidal noise in the Fourier field.

According to an embodiment, the heavy-tailed law of the spectrum of the noise measurement is of Bernoulli-Gaussian type. According to an embodiment, the heavy-tailed law is given by a barycentre between a first distribution of Gaussian type calculated by the calculation module at each iteration and weighted by a weight, $\beta$ or $\beta_j$, non-zero and calculated by the calculation module at each iteration, and a second Dirac distribution calculated by the calculation module at each iteration and weighted by a weight $1-\beta$ or $1-\beta_j$, non-zero and calculated by the calculation module at each iteration.

According to an embodiment of the invention, the noise model of the measurement signal comprises a non-structured interfering noise Gaussian whereof the parameters are calculated by the calculation module at each iteration. Therefore, according to an embodiment of the invention the noise model of the measurement signal comprises non-structured interfering noise whereof the distribution of probability a priori is given by a third distribution of Gaussian type calculated by the calculation module at each iteration.

According to an embodiment of the invention, the noise model of the measurement signal resulting from a structured interfering noise model and from a non-structured interfering noise model is the convolution of a Gaussian law and of a heavy-tailed law whereof the parameters are calculated by the calculation module at each iteration. According to an embodiment, the heavy-tailed law of the spectrum of the noise measurement is of Bernoulli-Gaussian type. According to an embodiment, the convolution is a third distribution of Gaussian type calculated by the calculation module at each iteration and weighted by a non-zero weight, $1-\beta$ or $1-\beta_j$, calculated by the calculation module at each iteration and a fourth distribution of Gaussian type calculated by the calculation module at each iteration and weighted by a non-zero weight, $\beta$ or $\beta_j$, of the presence of structured noise and calculated by the calculation module at each iteration, the third distribution and the fourth distribution having variances different to each other and calculated by the calculation module at each iteration.

According to an embodiment of the invention, the parameters of the noise model of the measurement signal comprise at least the weight $\beta$ or $\beta_j$ and/or $1-\beta$ or $1-\beta_j$.

According to an embodiment of the invention, the parameters of laws of structured noise and of non-structured noise are considered as random variables to which laws of probability are assigned conjugated with the noise model. According to an embodiment of the invention, a conjugated law of probability a priori is allocated to hyperparameters of laws a priori of the parameters of the noise model. According to an embodiment of the invention, the precision parameter of the Gaussian law of non-structured noise is modelled by a Gamma law. According to an embodiment of the invention, in the event of a Bernoulli-Gaussian law for structured noise the probability $\beta$ of the presence of the structured noise is modelled by a uniform law a priori and the precision parameter of the Gaussian law of structured noise is modelled by a Gamma law a priori.

According to an embodiment of the invention, a Beta law of probability a posteriori is followed by the weight $\beta$ or $\beta_j$ and/or $1-\beta$ or $1-\beta_j$ and is calculated by the calculation module at each iteration.

According to an embodiment of the invention, a law of Gamma probability a priori is allocated to at least one $\tau_j$ and a law of Gamma probability a posteriori is calculated by the calculation module at each iteration, where $2\tau_j^{-1}$ is the variance of the third distribution.

According to an embodiment of the invention, a law of Gamma probability a priori is allocated to at least one $\eta_j$ and a law of Gamma probability a posteriori is calculated by the calculation module at each iteration, where

[Math. 24]

$$\eta_j = 1/(\zeta_j^{-1} + \tau_j^{-1})$$

is the variance of the fourth distribution,
$2\tau^{-1}$ is the variance of the third distribution,
$2\zeta_j^{-1}$ is the variance of the first distribution of Gaussian type.

According to an embodiment of the invention, the complex envelopes to be estimated are modelled by a law ensuring regularity of the envelopes and depends on a regularisation parameter $\gamma_k$ which plays the same role as the parameter $r_k$ in the Vold-Kalman method.

[Math. 25]

$$p(a^R, a^I | \gamma_1, \ldots, \gamma_K) = \prod_{k=1}^{K} p(a_k^R | \gamma_k) p(a_k^I | \gamma_k) = C_a \prod_{k=1}^{K} \gamma_k^N \exp(-\gamma_k \|A_p a_k\|^2)$$

where

[Math. 26]

$$C_a$$

is an constant independent from

[Math. 27]

$$\gamma_1, \ldots, \gamma_K$$

and

[Math. 28]

$$a$$

According to an embodiment of the invention, the parameter $\gamma_k$ is considered as a variable random and modelled by a conjugated Gamma law.

According to an embodiment of the invention, an auxiliary variable is added to the model to decouple the different components to be estimated. The interest of this auxiliary variable is not physical but is for implementation reasons only.

According to an embodiment of the invention, the auxiliary decoupling variable is defined by a model having a distribution of probability of normal circularly symmetrical complex law type, which is calculated by the calculation module at each iteration.

According to an embodiment of the invention, the first parameters of the noise model of the measurement signal comprise at least one variance of the or of at least one of the distributions of Gaussian type.

According to an embodiment of the invention, the calculation module is configured, at each of the successive iterations carried out, to:
  update the law of the complex envelopes from the parameters of the noise model, the auxiliary variable, the regularisation parameters and the observation,
  update the parameters of the noise model from the updated envelopes.

According to an embodiment of the invention, at each iteration regularisation parameters of the model are updated by the calculation module from the updated complex envelopes.

According to an embodiment of the invention, a Gamma law of probability a priori is allocated to at least one of the regularisation parameters and results from a Gamma law a posteriori whereof the parameters are calculated by the calculation module at each iteration.

According to an embodiment of the invention, at each iteration an auxiliary decoupling variable of the complex envelopes of the components between them in the model is updated by the calculation module, from the updated complex envelopes and from the parameters of the updated noise model.

According to an embodiment of the invention, the auxiliary decoupling variable is defined by a model having a distribution of probability of complex circularly symmetrical normal law type, which is calculated by the calculation module at each iteration.

According to an embodiment of the invention, the convergence test comprises testing by the calculation module at each current iteration that the difference between the absolute value of the envelope calculated from the current iteration and the absolute value of the envelope calculated from the preceding iteration is less than a prescribed threshold.

According to an embodiment of the invention, the complex envelopes having been calculated are analysed by the calculation module, and the communication of an alarm is triggered by the calculation module on at least one physical outlet as a function of the complex envelopes having been analysed.

A second subject matter of the invention is a monitoring device of at least one rotating machine of an aircraft for executing the method such as described hereinabove, the device comprising
  a module for acquiring at least one measurement signal of the rotating machine,
  characterised in that the device comprises
  a module for estimating instantaneous frequencies of sinusoidal components of the measurement signal,
  a calculation module configured, at each of several successive iterations carried out, to:
    update complex envelopes of the sinusoidal components,
    update parameters of a noise model of the measurement signal from the updated complex envelopes,
    test whether the model converges from the preceding iteration to the current iteration, to:
      in the negative, redo a new iteration,
      in the affirmative, perform a calculation of the complex envelopes from the iterations carried out.

According to an embodiment of the invention, the complex envelopes of the sinusoidal components are updated independently.

According to an embodiment of the invention, the calculation module is configured, at each of the successive iterations carried out, to:
  update regularisation parameters of the model from the updated complex envelopes According to an embodiment of the invention, the calculation module is configured, at each of the successive iterations carried out, to:
  update an auxiliary decoupling variable of the complex envelopes of the components between them in the model, from the updated complex envelopes and from the parameters of the updated noise model.

According to an embodiment of the invention, the calculation module is configured to analyse the complex envelopes having been calculated, and is able to trigger the communication of an alarm on at least one physical outlet of the device as a function of the complex envelopes having been analysed.

A second subject matter of the invention is a computer program comprising code instructions for executing the monitoring method such as described hereinabove, when it is executed on a computer.

A third subject matter of the invention is an aircraft comprising at least one rotating machine and a monitoring device of the at least one rotating machine such as described hereinabove.

Figure 2:
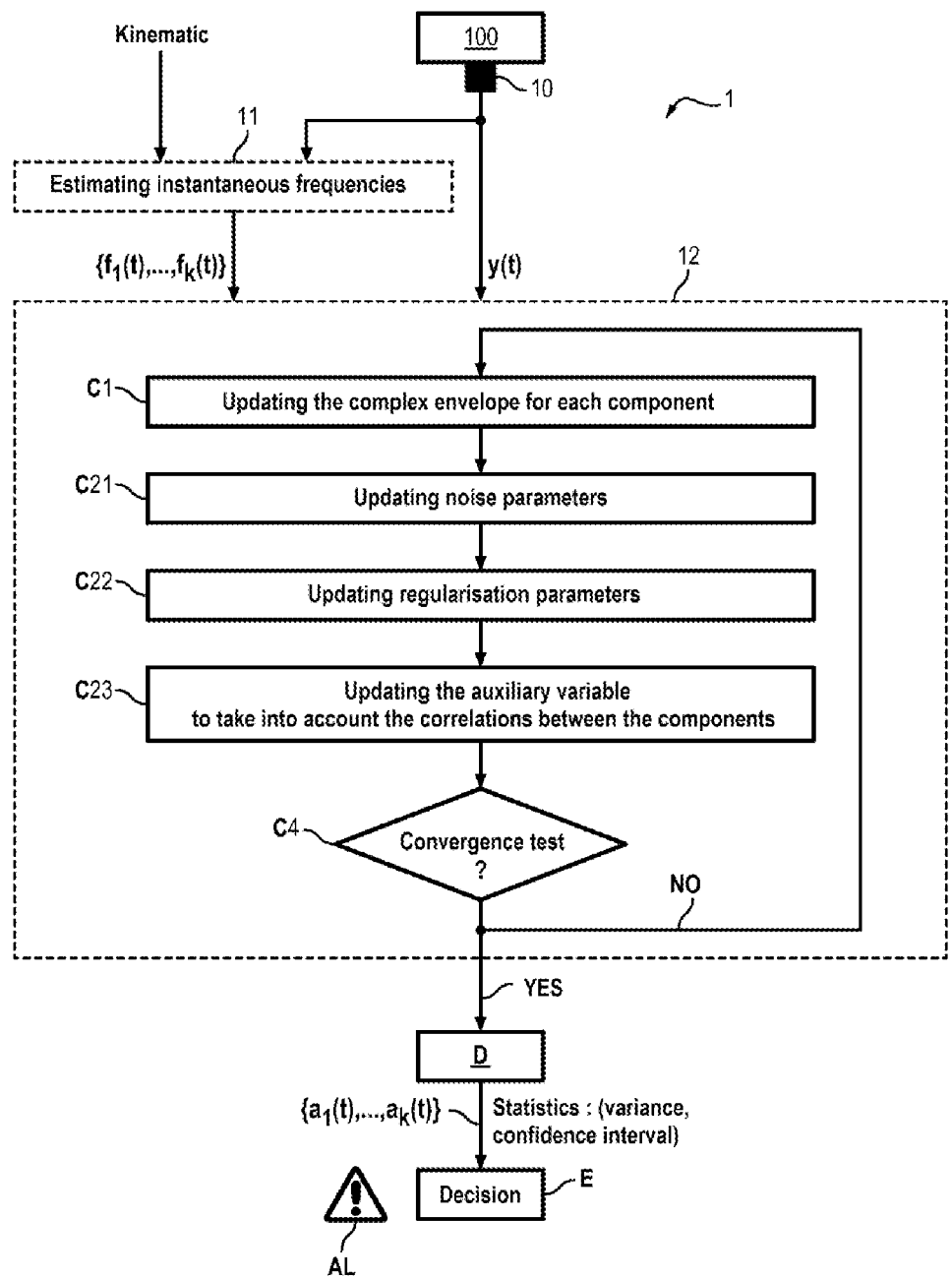
Figure 3:
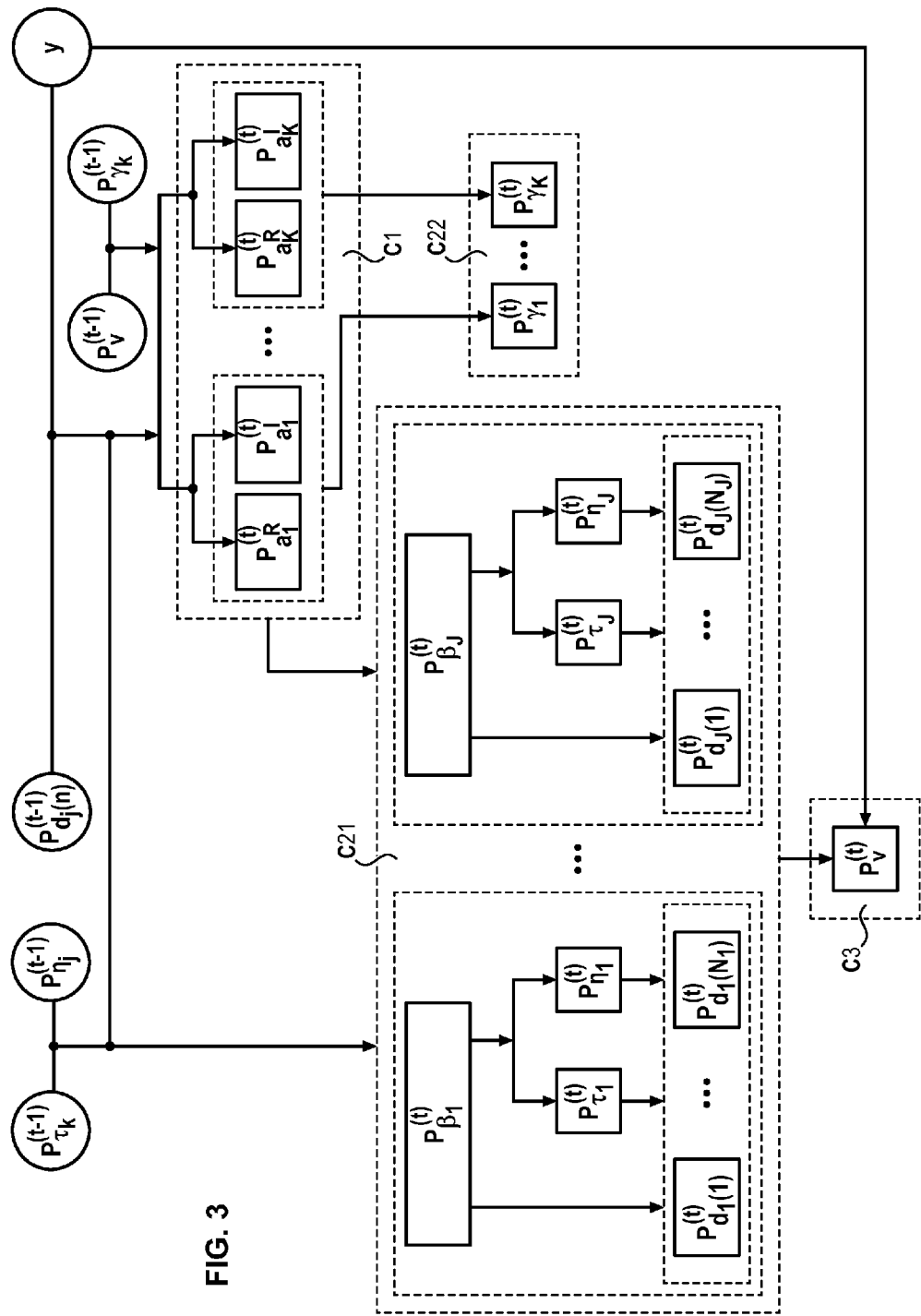
Figure 4A:
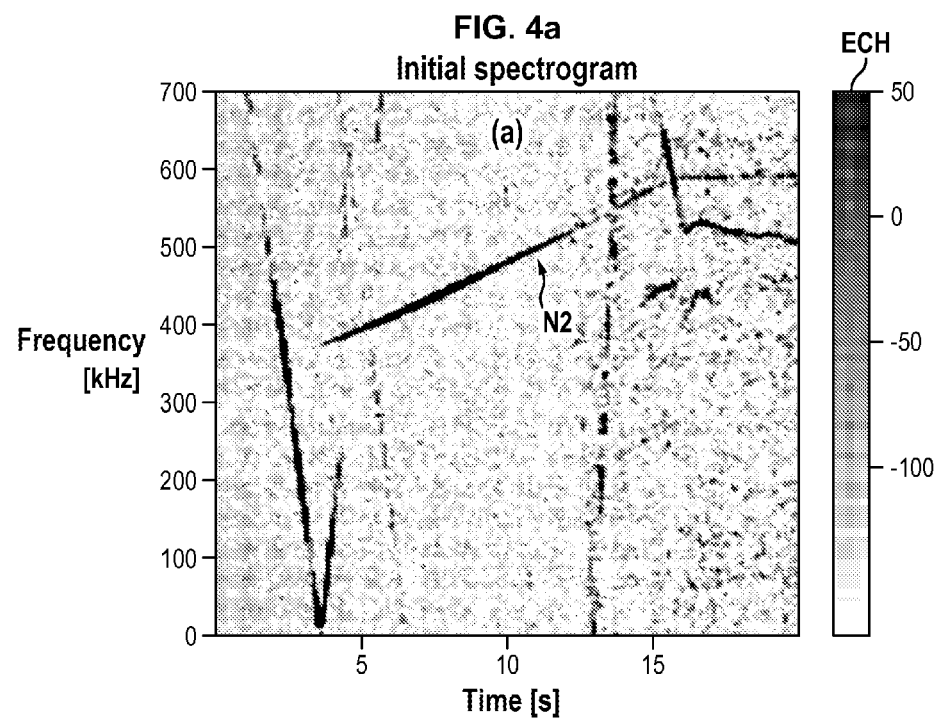
Figure 4B:
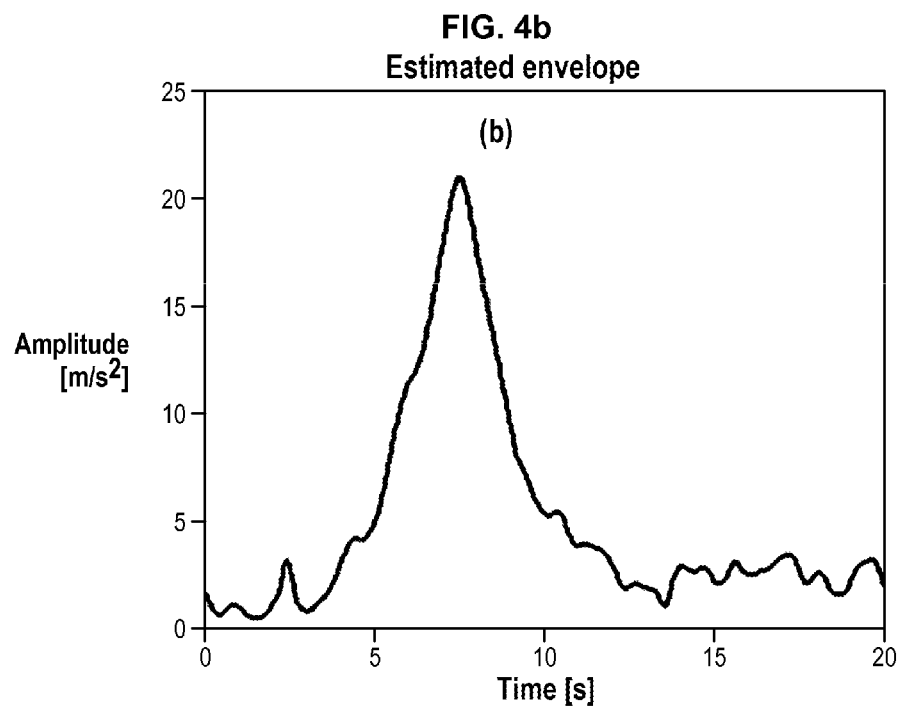
Figure 5:
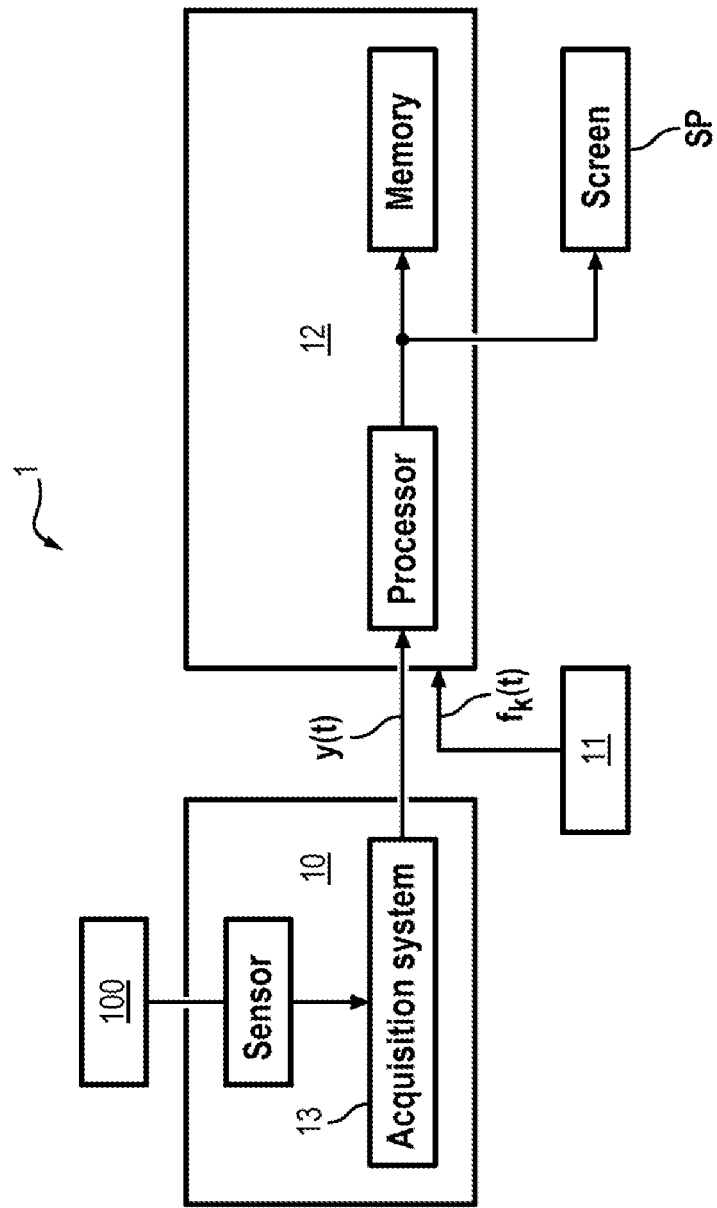

The invention will be better understood from the following description given solely by way of non-limiting example in reference to the figures of the appended drawings, in which:

FIG. 1 schematically illustrates the evolution of the signal-to-noise ratio of a component estimated according to a method of the prior art, FIG. 2 illustrates an explanatory diagram of the device and of the monitoring method according to an embodiment of the invention, FIG. 3 illustrates an explanatory flowchart of a part of the monitoring method according to an embodiment of the invention, FIG. 4a shows the initial spectrogram of a measured signal, FIG. 4b shows an example of an envelope having been calculated by the device and the monitoring method according to an embodiment of the invention, FIG. 4c shows the spectrogram of a residual signal obtained from FIGS. 4a and 4b by the device and the monitoring method according to an embodiment of the invention, FIG. 4d shows the spectrogram of a residual signal obtained by adjusting a method of the prior art, FIG. 4e shows the spectrogram of a residual signal obtained by other adjustment of a method of the prior art, FIG. 4f shows the spectrogram of a residual signal obtained by even other adjustment of a method of the prior art, FIG. 5 illustrates a modular block diagram of the monitoring device according to an embodiment of the invention.

The monitoring device 1 of one or more rotating machines 100 embedded on an aircraft is described hereinbelow in reference to the figures. The rotating machine 100 can be a rotating propulsion machine of the aircraft, which can be one or more turbomachines, such as for example one or more turbojets or one or more turboprop. The aircraft can be a plane or a helicopter.

The monitoring device 1 performs the steps of the monitoring method of the rotating machine 100, described hereinbelow.

In FIGS. 2 and 5, the monitoring device 1 comprises an acquisition module 10 for acquiring one or more measurement signals y(t) for measuring of one or more magnitudes on the rotating machine 100 while this rotating machine 100 is operating as a function of the time t. The measurement signal y(t) can be a measurement signal y(t) of vibrations or acoustics, for example of a rotor and/or a stator, the signal being due to rotation of the rotor relative to the stator. The measurement signal y(t) of vibrations can be measured on a helicopter on a gas generator and/or on a gearbox and/or on a meshing and/or on a bearing. The measurement signal y(t) of vibrations can be measured on a plane, on a stator of a turbomachine. The acquisition module 10 can comprise one or more sensors, embedded on or near the rotating machine 100 on the aircraft, for measuring the signal or signals y (t), which can comprise for example one or more measurement accelerometers of the vibratory signal y(t) and/or one or more measurement microphones of the vibratory signal y(t) acoustic, and/or one or more sensor (encoder or other) of rotation speed of a shaft or of a rotor of the rotating machine 100, or other.

According to an embodiment, the acquisition module 10 enables to measure and acquire a vibratory or acoustic signal generated by the rotating machine 100 operating. The sensor enables to obtain an analogue signal representative of the vibratory or acoustic signal which is connected to an acquisition chain 13 configured to provide the digital measurement signal y(t)=y (nTe) with $T_e$ the non-zero sampling period, where $T=nT_e$ represents different sampling instants, where n can be for example natural integer numbers. As a consequence, hereinbelow the variable n is a temporal variable. This acquisition chain 13 in this case comprises a conditioner, an anti-aliasing analogue filter, a sampler blocker and an analogue-digital converter.

The measurement signal y(t) comprises K sinusoidal components of interest $x_k=a_k(n)\exp(j\Phi_k(n))$, the sum of which is equal to x(n) according to the equation hereinbelow:

$$x(n) = \sum_{k=1}^{K} a_k(n)\exp(j\phi_k(n)) \quad \text{[Math. 29]}$$

I={1, . . . , K} designates the set of indices of components of interest of the measurement signal y(t).

$\Phi_k(n)$ designates the phase of each sinusoidal component of interest $x_k=a_k(n)\exp(j\Phi_k(n))$.

$a_k$ (n) designates the complex amplitude (or complex envelope mentioned hereinbelow) of each component of interest $a_k(n)\exp(j\Phi_k(n))$ or the temporal derivative of any order of this component of interest $a_k$ (n)$\exp(j\Phi_k$ (n)).

In FIGS. 2 and 5, the monitoring device 1 comprises an estimation module 11 for estimating several instantaneous frequencies $f_k(t)$ of the sinusoidal components $x_k=a_k(n)\exp(j\Phi_k(n))$ of the measurement signal y(t), where k is a natural integer number varying from 1 to K, and where K is a prescribed natural integer number greater than 1. These instantaneous frequencies $f_k(t)$ are frequencies to be monitored in the rotating machine 100 (for example the first order of the gas generator, of the free turbine, of the shaft of the reducer, the meshing frequencies of the gearbox and of the meshings in the starter, or other).

According to an embodiment of the invention, a rotation frequency $f_{ref}(t)$ of a reference shaft of the rotating machine 100 (which can be for example the shaft of its rotor) can have been prescribed in advance in the estimation module 11. The rotation frequency $f_{ref}(t)$ can be calculated from the speed signal measured by a rotation speed sensor forming part of the acquisition module 10 or from the vibratory or acoustic signal y(t) provided by the acquisition module 10. The estimation module 11 can calculate the instantaneous frequency $f_k(t)$ of each sinusoidal component $x_k=a_k(n)\exp(j\Phi_k(n))$ as being proportional to the rotation frequency $f_{ref}(t)$ according to the equation $f_k(t)=c_k f_{ref}(t)$, where each proportionality coefficient $c_k$ of the instantaneous frequency $f_k(t)$ is real. Since the connection between the different components of the kinematic chain of the rotating machine 100 is rigid, the proportionality coefficients $c_k$ can have been prescribed in advance in the estimation module 11. In FIG. 2, the elements of the machine 100 which are monitored are specified in advance and their kinematic is prescribed in the estimation module 11, without any need for the user to give the frequencies $f_k(t)$ in entries.

For example hereinbelow n is a natural integer number ranging from 1 to N, where N is a prescribed natural integer number greater than 1.

It is assumed that the measurement signal y(n) is equal to the sum of the K components of interest $a_k(n)\exp(j\Phi_k(n))$ to which the non-structured interfering signal (or noise) l(n) of Gaussian type (also called wideband) is added, and the structured interfering signal (or noise) e(n) (also called narrowband), according to the following equation:

$y(n)=x(n)+e(n)+l(n)$

According to an embodiment of the invention, the structured interfering signal (or noise) e(n) is defined as being the part of the interfering noise whereof the Fourier transform is discrete, that is this noise e(n) can be written as the sum of sinusoidal signals. In practice, this noise e(n) is constituted by the residual sinusoidal components not included in the signal x(n). The Fourier transform of the structured interfering noise e(n) is constituted by peaks each linked to a sinusoid. It is said that the spectrum of the structured noise e(n) is characterised by a parsimonious look.

According to an embodiment of the invention, the non-structured interfering signal (or noise) l(n) is defined as being that part of the interfering noise whereof the Fourier transform is not discrete. The non-structured interfering noise l(n) is constituted by the non-sinusoidal random components whereof the spectrum is not discrete. This non-structured interfering noise l(n) can be for example aerodynamic noise and is modelled by a Gaussian law.

According to the invention, e(n) incorporates a random signal following a law other than a normal law and must favour a parsimonious spectrum.

As a reminder and by definition in general, a normal or complex Gaussian law $f(x)=NC(\mu,\sigma^2)$ in a real dimension is defined as the distribution of average $\mu$ and standard deviation a or variance $\sigma^2$ having the density of probability f(x) according to the following equation:

[Math. 30]
$$f(x) = \frac{1}{\sigma\pi}e^{-(\frac{x-\mu}{\sigma})^2}$$

The signal (or structured interfering noise) e(n) represents the residual harmonic signal, and can be noted in the following form:

[Math. 31]
$$e(n) = \sum_{k \in \bar{I}} a'_k(n)\exp(j\phi_k(n))$$

where

[Math. 32]

$\bar{I}$ is the set of indices of the sinusoidal components of the structured interfering signal e (n), which are each distinct from the indices of the set I.

The total interfering signal or total noise of the measurement signal y (t) is equal to the sum b (n) of the non-structured Gaussian interfering signal (or noise) l(n) and of the structured interfering signal (or noise) e(n) according to the following equation:

$$b(n)=e(n)+l(n)$$

Calculation of the sinusoidal components of interest $a_k(n)$ $\exp(j\Phi_k(n))$ is of Bayesian type. Therefore, n, x(n), e(n) and l(n) are the temporal successive realisations of random variables the laws of which will be defined hereinbelow. Also, x(n), e(n) and l(n) are independent of each other.

Hereinbelow, the exponent R designates the real part and the exponent I designates the imaginary part (distinct from the above set I).

The vector $y^R$ is defined as being the real observation vector, formed from the real N values $y(n)^R$ of y(n) for the natural integer number n ranging from 1 to N, according to the following equation:

[Math. 33]

$$y^R[y(1)^R, \ldots, y(n)^R, \ldots, y(N)^R]^T$$

where the exponent T designates the transpose.

The vector $y^I$ is defined as being the imaginary vector of observation, formed by the N imaginary values $y(n)^I$ of y (n) for n ranging from 1 to N, according to the following equation:

[Math. 34]

$$y^I=[y(1)^I, \ldots, y(n)^I, \ldots, y(N)^I]^T.$$

The vectors $x^R, x^I, x_k^R, x_k^I, l^R, l^I, e^R, e^I$ are also formed by the real or imaginary N values of x (n) or l(n) and e(n), for n ranging from 1 to N.

Noise Model

A law of observation of noise b(n) or noise model b(n) is defined hereinbelow. This noise model b(n) is calculated by a calculation module 12 (or monitoring unit 12) in FIG. 2.

The calculation module 12 is digital (as opposed to analogue circuits). The calculation module 12 is automatic in the sense where it automatically performs the steps described hereinbelow. As shown in FIG. 5, the calculation module 12 can be or comprise one or more calculators, and/or one or more computers, and/or one or more calculating machines, and/or one or more processors and/or one or more microprocessors. The calculation module 12 and/or the acquisition module 10 can comprise a computer program loaded in their memory to automatically execute the steps described hereinbelow. Also, the monitoring device 1 can comprise one or more physical outlets SP for presentation of information to present to a user the complex envelopes $a_k(n)$ having been calculated by the module 12, wherein this physical outlet or these physical outlets SP can comprise a display screen for displaying these complex envelopes $a_k(n)$ having been calculated (or their derivative of any order (amplitude, phase, amplitude as a function of speed, the estimated component or the estimated components, etc.)). The memory is provided for storing the outlets $a_k(n)$ having been calculated by the calculation module 12.

Structured Noise Model e(n) The structured interfering noise model e(n) can be realised by one of the embodiments described hereinbelow.

The noise model e(n) is defined as being a structured interfering signal as follows. According to an embodiment of the invention, the spectrum of the structured interfering noise e(n) is defined by a model having a parsimonious spectrum, that is, a distribution concentrated at zero for favouring zero values with a large probability and having heavier tails than the normal law to authorise the presence of high values. For example, a good distribution of probability of the spectrum of structured interfering noise e(n) can be defined by a model being a mix of a finite/infinite number of different weighted distributions.

According to an embodiment of the invention, the spectrum of narrowband interfering noise is defined by a weighted sum of a distribution of probability of Gaussian type and of another distribution of probability of non-Gaussian type.

Of the distributions of infinite mixes, there is for example the Laplace law and the Student law currently used for modelling parsimonious signals and which can be expressed as infinite mixes of Gaussians with parameters of mixes following gamma laws and inverse gamma laws respectively. Of the distributions of finite mixes, there is for example the mix of two distributions: of a Bernoulli distribution and of a Gaussian distribution known as Bernoulli-Gaussian. In the case of the Bernouilli model, the spectrum of the structured interfering noise e(n) is defined by a model having a distribution of probability given by the barycentre between a distribution of Gaussian type $NC(0, 2\zeta^{-1})$ weighted by a weight (probability) $\beta$ of the presence of interfering noise e(n) and a Dirac distribution $\delta_0$ weighted by a weight $1-\beta$, for example as per the following equation:

[Math. 35]

$$\forall n \in \{1, \ldots, N\} [F_N e]_n | \beta, \zeta \sim (1-\beta)\delta_0 + \beta NC(0, 2\zeta^{-1})$$

where $F_N$ designates the discrete Fourier transform operator of size N, this operator being divided by

[Math. 36]

$$\sqrt{N},$$

$\delta_0$ is the Dirac distribution positioned at the zero abscissa, $0 \leq \beta \leq 1$, is the probability of the presence of the structured noise, $NC(0, 2\zeta^{-1})$ designates a normal complex distribution of zero average, whereof the variance is equal to $2\zeta^{-1}$. Therefore, the real part of this normal complex distribution $NC(0, 2\zeta^{-1})$ is a Gaussian distribution of zero average and variance $\zeta^{-1}$. The imaginary part of this normal complex distribution $NC(0, 2\zeta^{-1})$ is a Gaussian distribution of zero average and variance $\zeta^{-1}$.

According to an embodiment, $\beta$ is different from zero.

Hereinabove, $[F_N e]_n$ designates the discrete Fourier transform operator of size N, which is divided by

[Math. 37]

$$\sqrt{N}$$

and is applied to e (n). Therefore, there is $$F_N = \frac{1}{\sqrt{N}} DFT_N \quad \text{[Math. 38]}$$

And $$F_N^T F_N = F_N F_N^T = Id \quad \text{[Math. 39]}$$

where Id designates the matrix identity.

Unlike the known Vold-Kalman method, where the noise is assumed as a Gaussian centre, this embodiment easily takes structured noise into account in the model to improve the efficacy of the estimation at the time of coupling without need to estimate the interfering components.

In variable mode, the spectrum of e(n) can have wider peaks. Fourier transforms $S_j$, limited to a temporal segment of size $N_j$ for e(n) are defined as follows:

[Math. 40]

$$\forall j \in \{1, \ldots, J\} \forall n \in \{1, \ldots, N_j\} [S_j e]_n | \beta_j, \zeta_j \sim (1-\beta_j)\delta_0 + \beta_j NC(0, 2\zeta_j^{-1})$$

with

[Math. 41]

$$S_j = F_{N_j} P_j$$

where $P_j$ is a selection matrix of size

[Math. 42]

$$N_j \times N,$$

$N_j$ is a prescribed natural integer number less than N ($N_j$ is the length of the window), $$F_{N_j} = \frac{1}{\sqrt{N_j}} DFT_{N_j} \quad \text{[Math. 43]}$$

with $$DFT_{N_j} \quad \text{[Math. 44]}$$

the discrete Fourier transform of size $N_j$, n is a natural integer number ranging from 1 to $N_j$, J is a prescribed natural integer number (number of temporal windows j), j is a natural integer number ranging from 1 to J, $NC(0, 2\zeta_j^{-1})$ designates a normal complex distribution of zero average, whereof the variance is equal to $2\zeta_j^{-1}$, $\beta_j$ is the weight of the presence of structured noise, allocated to $NC(0, 2\zeta_j^{-1})$, $0 \leq \beta_j \leq 1$, $1-\beta_j$ is the weight allocated to the Dirac distribution positioned at the zero abscissa. Fourier transforms $S_j$ are therefore of shorter duration than $F_N$.

If, also, the matrices $P_j$ have disjointed supports, this gives

[Math. 45]

$$P_j P_j^T = Id$$

and therefore

[Math. 46]

$$S_j S_j^T = Id$$

The matrices $P_j$ have disjointed supports if the sum of all the $N_j$ is equal to N:

$$\sum_{j=1}^{J} N_j = N \quad \text{[Math. 47]}$$

The selection matrix $P_j$ is such that it selects $N_j$ values belonging to the window j of a vector of size N.

$P_j$ is a matrix containing $N_j$ lines and N columns, it is defined by:

For j=1:

[Math. 48]

$$\forall i_0 \in \{1, \ldots, N_j\} i_1 \in \{1, \ldots, N\} P_j(i_0, i_1) = 1 \text{ if } i_1 = i_0 \text{ if not } P_j(i_0, i_1) = 0.$$

For j>1

[Math. 49]

$$\forall i_0 \in \{1, \ldots, N_j\} i_1 \in \{1, \ldots, N\} P_j(i_0, i_1) = 1 \text{ if } i_1 = i_0 + \Sigma_{j_0=0}^{j-1} N_{j_0} \text{ if not } P_j(i_0, i_1) = 0.$$

Unlike the known Vold-Kalman method where noise is assumed to be stationary, which is rarely the case of aerodynamic noise, this embodiment takes into account the non-stationary aspect of noise, and does this by analysing the signal via short-term Fourier transforms $S_j$ mentioned hereinabove. The time axis is divided into J intervals or windows. The parameters of the model can change from one window to the other. Given that the parameters of these laws are unknown (the level of aerodynamic noise is unknown and the coupling instants between the components and the amplitude of the interfering components are unknown), they are also going to be adapted automatically. Laws a priori are selected to model information a priori on these parameters.

In general, if there is no information a priori laws called non-informative can be chosen.

Non-Structured Noise Model l(n)

The non-structured interfering noise model l(n) can be created by one of the embodiments described hereinbelow.

According to an embodiment of the invention, the spectrum of the non-structured interfering noise l(n) is defined by a model having a distribution of probability of Gaussian type.

According to an embodiment of the invention, the spectrum of the non-structured interfering noise l(n) is defined by a model having a distribution of normal complex probability $NC(0, 2\ \sigma^{-1})$ of zero average and of variance $2\sigma^{-1}$, for example according to the following equation:

[Math. 50]

$$\forall n \in \{1, \ldots, N\} [F_N l]_n | \sigma \sim NC(0, 2\ \sigma^{-1})$$

It can be that the background noise is non-stationary. In this case, the procedure can be via temporal segments j as was done for the interfering signal e(n). Fourier transforms $S_j$, limited to a temporal segment of size N, for l(n), are defined as follows:

[Math. 51]

$$\forall j \in \{1, \ldots, J\} \forall n \in \{1, \ldots, N_j\} [S_j l]_n | \beta_j, \zeta_j \sim NC(0, 2\tau_j^{-1})$$

where j, J, n, $N_j$, $S_j$, $\beta_j$, $\zeta_j$ have the definitions mentioned hereinabove, $NC(0, 2\tau_j^{-1})$ designates a normal complex distribution of zero average, whereof the variance is equal to $2\tau_j^{-1}$.

In each temporal window j, the non-structured interfering noise l(n) is Gaussian and has a variance $2\tau_j^{-1}$. This is shown as

[Math. 52]

$$[P_j l]_n | \tau_j \sim NC(0, 2\tau_j^{-1})$$

Total noise model b(n)

The total interfering noise model b(n) can be created by one of the embodiments described hereinbelow.

According to an embodiment of the invention, the spectrum of the interfering noise b(n) results from the models of the structured interfering noise and from the non-structured noise model. In fact, since e(n) and l(n) are independent, the density of probability of the sum b(n)=e(n)+l(n) is the convolution of the density of probability of the structured interfering noise e(n) with that of the non-structured noise l(n).

According to an embodiment of the invention, for example, in the case of a Bernoulli-Gaussian law for the structured noise, the spectrum of the total interfering noise b(n) is defined by a model having a mix of two distributions of Gaussian type each having an associated weight and different variances.

According to an embodiment of the invention, the spectrum of the total interfering noise b(n) is defined by a model having a distribution given by the barycentre between the distribution $NC(0, 2\tau_j^{-1}$ of Gaussian type weighted by the weight $1-\beta_j$ and a distribution $NC(0, 2\tau_j^{-1}+\tau_j^{-1}))$ of Gaussian type weighted by the weighting $\beta_j$, for example according to the following equation:

[Math. 53]

$$\forall j \in \{1, \ldots, J\}, \forall n \in \{1, \ldots, N_j\} [S_j b]_n | \tau_j, \zeta_j, \beta_j \sim (1-\beta_j) NC(0, 2\tau_j^{-1}) + \beta_j NC(0, 2(\zeta_j^{-1}+\tau_j^{-1}))$$

where j, J, n, $N_j$, $S_j$, $\beta_j$, $\zeta_j$, $\tau_j$ have the definitions mentioned hereinabove.

$NC(0, 2(\zeta_j^{-1}+\tau_j^{-1}))$ designates a normal complex distribution of zero average, whereof the variance is equal to 2 $(\zeta_j^{-1}+\tau_j^{-1})$.

As follows,

[Math. 54]

$$\eta_j = 1/(\zeta_j^{-1}+\tau_j^{-1})$$

Therefore, in this embodiment, the spectrum of the total interfering noise b(n) is defined by a model having a distribution given by the barycentre between the distribution $NC(0, 2\tau_j^{-1})$ of Gaussian type weighted by the weight $1-\beta_j$ and a distribution $NC(0, 2\eta_j^{-1})$ of Gaussian type weighted by the weight) $\beta_j$, for example according to the following equation:

[Math. 55]

$$\forall j \in \{1, \ldots, J\} \forall n \in \{1, \ldots, N_j\} [S_j b]_n | \tau_j, \zeta_j, \beta_j \sim (1-\beta_j) NC(0, 2\tau_j^{-1}) + \beta_j NC(0, 2\eta_j^{-1})$$

where j, J, n, $N_j$, $S_j$, $\beta_j$, $\zeta_j$, $\tau_j$, $\eta_j$ have the definitions mentioned hereinabove, $NC(0, 2\eta_j^{-1})$ designates a normal complex distribution of zero average, whereof the variance is equal to $2\eta_j^{-1}$, with in $\eta_j < \tau_j$.

$\tau_j$ and $\eta_j$ are also called noise precision parameters.

The law of observation $y^R$, $y^I$ of the measurement signal y(t) is given by the Gaussian N according to the following hierarchical model:

[Math. 56]

$$\begin{cases} \forall j \in \{1, \ldots, J\} \forall n \in \{1, \ldots, N\} d_j(n) | \tau_j, \\ \eta_j, \beta_j \sim (1-\beta) \delta_{\tau_j^{-1}} + \beta_j \delta_{\eta_j^{-1}} \\ y^R | a, d \sim N\left([Ca]^R, 2\sum_{j=1}^{J} S_j^\top \mathrm{diag}(d_j) S_j\right) \\ y^I | a, d \sim N\left([Ca]^I, 2\sum_{j=1}^{J} S_j^\top \mathrm{diag}(d_j) S_j\right) \end{cases}$$

where the matrix C is the diagonal matrix formed by the terms $\exp(j\Phi_k(n))$ for n ranging from 1 to N and k ranging from 1 to K, a is the vector of the envelopes, $\mathrm{diag}(d_j)$ is a matrix the diagonal of which is formed by the coefficients $d_j$ and whereof the other coefficients are zero, $d_j$ is a variable which follows a distribution given by the barycentre between a Dirac distribution

[Math. 57]

$$\delta_{\tau_j^{-1}}$$

positioned in the abscissa $\tau_j^{-1}$ and weighted by the weight $1-\beta_j$ and a Dirac distribution

[Math. 58]

$$\delta_{\eta_j^{-1}}$$

positioned in the abscissa $\eta_j^{-1}$ and weighted by the weight $\beta_j$.

According to an embodiment of the invention, the law a posteriori of $d_j$ is a distribution given by the barycentre between a Dirac distribution

[Math. 59]

$$\delta_{\tau_j^{-1}}$$

positioned in the abscissa $\tau_j^{-1}$ and weighted by the weight $1-p_j(n)$ and a Dirac distribution

[Math. 60]

$$\delta_{\eta_j}^{-1}$$

positioned in the abscissa $\eta_j^{-1}$ and weighted by the weight $p_j(n)$, for example according to the following equation: P
[Math. 61]

$$\forall j \in \{1, \ldots, J\}$$

[Math. 62]

$$\forall n \in \{1, \ldots, N_j\}$$

[Math. 63]

$$d_j(n) | \tau_j, \eta_j, \beta_j, a \sim (1-p_j(n))\delta_{\tau_j}^{-1} + p_j(n)\delta_{\eta_j}^{-1} + p_j(n)\delta_{\eta_j}^{-1}$$

In the above, $$p_j(n) = \frac{w_j(n)}{1 + w_j(n)}$$ [Math. 64]

$$w_j(n) = \frac{\beta_j}{1-\beta_j}\exp\left(-\frac{(\eta_j - \tau_j)\eta_j}{2\tau_j}|[S_j(Ca-y)]_n|^2\right) \text{ if } n \in \{1, N_j\}$$ [Math. 65]

$$w_j(n) = \frac{\beta_j}{1-\beta_j}\exp\left(-\frac{(\eta_j - \tau_j)\eta_j^2}{2\tau_j^2}|[S_j(Ca-y)]_n|^2\right) \text{ if not}$$ [Math. 66]

Also, $\text{diag}(d_j)$ or $\text{diag}(d_j(n))$ is a diagonal covariance matrix of the noise.

Iteration of Calculation of the Complex Envelopes $a_k(n)$ of the Sinusoidal Components According to the invention, the monitoring device 1 comprises a calculation module 12 configured, at each respective iteration carried out, to:
- during a first step C1 of the respective iteration carried out update the laws (calculate or give a value to the parameters (average and variance) of the law) of the complex envelopes $a_k(n)$ of the sinusoidal components,
- during a second step C21 of the respective iteration carried out (after the first step C1 of the respective iteration carried out) update the parameters of the noise model $b(n)$ and/or $e(n)$ and/or $l(n)$ of the measurement signal $(y(t))$ from the updated complex envelopes $a_k(n)$ or given the updated complex envelopes $a_k(n)$,
- during a third step C4 of the respective iteration carried out (after the second step C21 of the respective iteration carried out) test whether the model converges from the preceding iteration (t−1) to the current iteration (t), to:
  - in the negative (NO in FIG. 2), redo a new iteration of the steps C1, C21, C4 described hereinabove,
  - and in the affirmative (YES in FIG. 2), during the fourth step D following the third step C4, perform a calculation of the complex envelopes $a_k(n)$ from the iterations carried out, to obtain automatic extraction of the sinusoidal components $a_k(n)$.

The updating of the noise parameters can be done independently on the j ranging from 1 to J. At each iteration t, given the laws a posteriori of the variables at the preceding iteration t−1 and the observation y, laws a posteriori of the different variables are updated by the calculation module 12, for example according to the diagram shown in FIG. 3.

The third test step C4 enables to verify whether the laws of the different variables of the problem to be estimated at a given iteration are definitely optimal. According to an embodiment of the invention, the test of the third step C4 comprises automatic calculation of one or more indicators by the calculation module 12 from the envelopes $a_k(n)$ having been calculated (for example their absolute value).

According to an embodiment of the invention, the test of the third step C4 can be performed by the calculation module 12 which compares the absolute value of the difference between the average of the law of the envelope $a_k(n)$ calculated from the current iteration and the average of the law of the envelope $a_k(n)$ calculated from the preceding iteration to a threshold prescribed in advance, to determine whether this difference is less than this threshold (affirmative convergence hereinabove (YES in FIG. 2) when this difference is less than the threshold; negative convergence hereinabove (NO in FIG. 2) when this difference is not less than the threshold). For example, this threshold can be prescribed between $10^{-3}$ and $10^{-6}$ times the norm of the average of the law of the envelope $a_k(n)$ calculated from the preceding or current iteration. The test of the third step C4 can also be performed by the calculation module 12 on one or more of the described variables of the noise model, such as for example an average, a variance or other, for example of the calculated envelope $a_k(n)$, to test if this variable converges from the preceding iteration to the current iteration. As long as the statistics are not stabilised (NO in FIG. 2), the algorithm continues to update the variables iteratively.

According to an embodiment of the invention, during the fourth step D, the calculation of the complex envelopes $a_k(n)$ can be performed by the calculation module 12 from the average of the estimated law. Additional statistics can also be given as the confidence interval.

According to an embodiment of the invention, a maximal number of iterations is prescribed in advance in the calculation module 12.

Parameters of the Noise Model

According to an embodiment of the invention, these parameters can be one or more of the parameters configuring the Gaussian law of the non-structured noise (average, precision) and those configuring the heavy-tailed law of the structured noise (average, precision, form parameter etc) and this for one or more windows of the J windows.

According to an embodiment of the invention, in the case of a Bernoulli-Gaussian model these parameters can be one or more or all of the $\tau_j$ for j ranging from 1 to J, and/or one or more or all of the $\beta_j$ for j ranging from 1 to J, and/or one or more or all of the $\eta_j$ for j ranging from 1 to J, and/or one or more or all of the $\zeta_j$ for j ranging from 1 to J.

This embodiment of the parameters can be realised by one or more of the other embodiments described hereinbelow.

According to an embodiment of the invention, a law of probability a priori is predefined for these parameters.

According to an embodiment of the invention, conjugated laws are selected. This facilitates calculations by the calculation module 12.

According to an embodiment of the invention, in the case of a Bernoulli-Gaussian model for structured noise, a law of uniform probability over the interval ranging from 0 to 1 is allocated to one or more or all the $\beta_j$, that is

[Math. 67]

$$\beta_j \sim U(0,1) \forall j \in \{1, \ldots, J\}$$

According to an embodiment of the invention, a law of probability of Beta law type is allocated to one or more or all the $\beta_j$.

By way of reminder, by convention and in general, a Beta law (noted Beta($\alpha$, H)) having a third adjustment $\alpha$ (strictly positive real) and a fourth adjustment H (strictly positive real) is defined by the function of density of probability f(x; α, H) according to the equation hereinbelow:

[Math. 68]
$$f(x;\alpha, H) = \begin{cases} \dfrac{x^{\alpha-1}(1-x)^{H-1}}{\int_0^1 u^{\alpha-1}(1-u)^{H-1}du} & \text{for } x \in [0,1] \\ 0 & \text{if not} \end{cases}$$

According to an embodiment of the invention, the law a posteriori of one or more or all the $\beta_j$ resulting from a uniform law a priori and given the observations y(n) is a law Beta($2n_1+1$, $2n_2+1$) according to the following equation:

[Math. 69]
$$\forall j \in \{1, \ldots, J\}$$

[Math. 70]
$$\beta_j \mid y, a, d, \tau_j, \eta_j \sim \text{Beta}(2.n_1 + 1, 2.n_2 + 1)$$

with

[Math. 71]
$$n_1 = \langle d_j(1) = \eta_j^{-1}\rangle + \langle d_j(N) = \eta_j^{-1}\rangle + \sum_{n=2}^{N_j-1} \langle d_j(n) = \eta_j^{-1}\rangle$$

[Math. 72]
$$n_2 = \langle d_j(1) = \tau_j^{-1}\rangle + \langle d_j(N) = \tau_j^{-1}\rangle + 2\sum_{n=2}^{N_j-1} \langle d_j(n) = \tau_j^{-1}\rangle$$

where the function < > used hereinabove means in general <P>=1 if P is true, or if not <P>=0.

This law of probability Beta($2n_1+1$,$2n_2+1$) is the law a posteriori which result from the law a priori (uniform law) and from the law of observations (law of y).

According to an embodiment of the invention, a law of Gamma probability is allocated to one or more or all the $\tau_j$, for example

[Math. 73]
$$\tau_j \sim \text{Gamma}(a_{\tau_j}, b_{\tau_j})$$

having

[Math. 74]
$$a_{\tau_j}$$

as first adjustment and

[Math. 75]
$$b_{\tau_j}$$

as second adjustment.

By way of reminder, by convention and in general, a Gamma law (noted Gamma(H, α)) having a first adjustment H (strictly positive real) and a second adjustment α (strictly positive real) is defined by the function of density of probability f(x; H, α) as per the equation hereinbelow:

[Math. 76]
$$f(x; H, \alpha) = \dfrac{x^{H-1}e^{-\alpha x}}{\Gamma(H)\alpha^H}$$

where Γ(H) is the gamma Euler function according to the equation hereinbelow

[Math. 77]
$$\Gamma(H) = \int_0^{+\infty} t^{H-1} e^{-t} dt$$

According to an embodiment of the invention, a law of Gamma probability is allocated to one or more or all the $\eta_j$, for example

[Math. 78]
$$\eta_j \sim \text{Gamma}(a_{\eta_j}, b_{\eta_j})$$

having

[Math. 79]
$$a_{\eta_j},$$

as first adjustment and

[Math. 80]
$$b_{\eta_j},$$

as second adjustment.
The adjustments

[Math. 81]
$$a_{\tau_j},$$

[Math. 82]
$$b_{\tau_j},$$

[Math. 83]
$$a_{\eta_j},$$

[Math. 84]
$$b_{\eta_j},$$

of Gamma laws are each strictly positive.
According to an embodiment of the invention,

[Math. 85]
$$a_{\tau_j},$$

[Math. 86]
$$b_{\tau_j},$$

[Math. 87]
$$a_{\eta_j},$$

[Math. 88]
$$b_{\eta_j},$$

of the Gamma laws are each prescribed in advance in the calculation module 12. Therefore,

[Math. 89]
$$a_{\tau_j},$$

[Math. 90]
$$b_{\tau_j},$$

[Math. 91]
$$a_{\eta_j},$$

[Math. 92]
$$b_{\eta_j},$$

of the Gamma laws are each a hyper-parameter quantifying information a priori on the first parameters to be estimated.

According to an embodiment of the invention, each couple (a, b) of first adjustment and second adjustment, such as for example

[Math. 93]

$$(a,b) \in \{(a_{\eta_j}, b_{\eta_j}))_{j \in \{1,\ldots,J\}}, (a_{\tau_j}, b_{\tau_j})_{j \in \{1,\ldots,J\}}\},$$

is prescribed in advance in the calculation module 12 according to information a priori on the distribution of the first parameter B considered with

[Math. 94]

$$\theta \in \{\eta_{j \in \{1,\ldots,J\}}, \tau_{j \in \{1,\ldots,J\}}\}.$$

These adjustments can be prescribed in advance by the user. If the user does not prescribe these adjustments, these adjustments are fixed to very low values close or equal to zero (see the example hereinbelow) to have non-informative laws. This information can be an average of the law considered for $\theta$ and/or a variance of the law considered for $\theta$. According to an embodiment of the invention, if the value of $\theta$ noted by $\theta_e > 0$ is known approximately with uncertainty equal to $\varepsilon \theta_e$ where $\varepsilon > 0$, then $$a = \frac{\theta_e}{\varepsilon} \quad \text{[Math. 95]}$$

and $$b = \frac{1}{\varepsilon} \quad \text{[Math. 96]}$$

are prescribed in advance. If there is no information a priori on the parameter $\theta$, alors a=b=0 are prescribed in advance (the law is non-informative). The presence of information a priori on the parameters most often accelerates convergence.

According to an embodiment of the invention, the law a posteriori of one or more or all the $\eta_j$ resulting from its Gamma law a priori of parameters (

[Math. 97]

$$a_{\eta_j},$$

[Math. 98]

$$b_{\eta_j},$$

and the measurement signal y(n) is a law

[Math. 99]

$$\text{Gamma}(\tilde{a}_{\eta_j}, \tilde{b}_{\eta_j})$$

having

[Math. 100]

$$\tilde{a}_{\eta_j}$$

as first adjustment and

[Math. 101]

$$\tilde{b}_{\eta_j}$$

as second adjustment according to the following equation:

[Math. 102]

$$\forall j \in \{1, \ldots, J\}$$

[Math. 103]

$$\eta_j | y, a \sim \text{Gamma}(\tilde{a}_{\eta_j}, \tilde{b}_{\eta_j})$$

According to an embodiment of the invention, the law a posteriori of one or more or all the $\tau_j$ resulting from its Gamma law a priori of parameters (

[Math. 104]

$$a_{\tau_j},$$

[Math. 105]

$$b_{\tau_j})$$

and the measurement signal y(n) is a Gamma law

[Math. 106]

$$\text{Gamma}(\tilde{a}_{\tau_j}, \tilde{b}_{\tau_j})$$

having

[Math. 107]

$$\tilde{a}_{\tau_j}$$

as first adjustment and

[Math. 108]

$$\tilde{b}_{\tau_j},$$

as second adjustment according to the following equation:

$$\forall j \in \{1, \ldots, J\} \quad \text{[Math. 109]}$$

$$\tau_j | y, a \sim \text{Gamma}(\tilde{a}_{\tau_j}, \tilde{b}_{\tau_j}) \quad \text{[Math. 110]}$$

In the above, $$\tilde{a}_{\eta_j} = a_{\eta_j} + n_1 \quad \text{[Math. 111]}$$

$$\tilde{b}_{\eta_j} = b_{\eta_j} + \frac{\eta_j}{2} \sum_{\substack{n \\ d_j(n) = \eta_j^{-1}}} |[S_j(Ca - y)]_n|^2 \quad \text{[Math. 112]}$$

$$\tilde{a}_{\tau_j} = a_{\tau_j} + n_2 \quad \text{[Math. 113]}$$

$$\tilde{b}_{\tau_j} = b_{\tau_j} + \frac{\tau_j}{2} \sum_{\substack{n \\ d_j(n) = \tau_j^{-1}}} |[S_j(Ca - y)]_n|^2 \quad \text{[Math. 114]}$$

Regularisation Parameters $\gamma_k$

According to an embodiment of the invention, the calculation module 12 is configured, during a fifth step C22 of the respective iteration carried out (following the second step C21 of the respective iteration carried out and prior to the third step C4) to update second regularisation parameters $\gamma_k$ of the model from the updated complex envelopes $a_k(n)$ or given the updated complex envelopes $a_k(n)$. These second regularisation parameters $\gamma_k$ are added restrictions imposed to favour regularity of the complex envelopes $a_k(n)$. These second regularisation parameters $\gamma_k$ characterise suppression of singularities in the components $a_k(n)$.

This embodiment of the second regularisation parameters $\gamma_k$ can be realised by one of the other embodiments described hereinbelow.

Updating of the second parameters can be done independently on the k ranging from 1 to K.

According to an embodiment of the invention, the density p of probability (a priori) of the complex envelopes $a_k(n)$ in the presence of these second regularisation parameters $\gamma_k$ is the following, for k ranging from 1 to K:

[Math. 115]
$$p(a^R, a^I | \gamma_1, \ldots, \gamma_K) =$$
$$\prod_{k=1}^{K} p(a_k^R | \gamma_k) p(a_k^I | \gamma_k) = C_a \prod_{k=1}^{K} \gamma_k^N \exp(-\gamma_k \|A_p a_k\|^2)$$

where $C_a$ is a constant independent from the $\gamma_k$ and from the complex envelopes $a_k(n)$.

According to an embodiment of the invention, a law of Gamma probability is allocated to one or more or all the second regularisation parameters $\gamma_k$, for example

[Math. 116]

$\gamma_k \sim \text{Gamma}(a_{\beta_k}, b_{\gamma_k})$ having

[Math. 117]

$a_{\gamma_k}$ as first adjustment and

[Math. 118]

$b_{\gamma_k}$ as second adjustment. According to an embodiment of the invention, the couple (

[Math. 119]

$a_{\gamma_k}$,

[Math. 120]

$b_{\gamma_k}$)

is prescribed in advance in the calculation module 12 according to information a priori on the distribution of the first parameter $\gamma_k$. This information can be an average of the law considered for $\gamma_k$ and/or a variance of the law considered for $\gamma_k$. These adjustments can be prescribed in advance by the user. If the user does not prescribe these adjustments, these adjustments are fixed to very low values close or equal to zero (see the example hereinbelow) to have non-informative laws. According to an embodiment of the invention, if the value of $\gamma_k$ noted by $\theta_e > 0$ is known approximately with uncertainty equal to $\varepsilon \theta_e$ where $\varepsilon > 0$, then $a_{\gamma_k} = \dfrac{\theta_e}{\varepsilon}$  [Math. 121]

and $b_{\gamma_k} = \dfrac{1}{\varepsilon}$  [Math. 122]

are prescribed in advance. If there is no information a priori on the parameter $\theta$, then

[Math. 123]

$a_{\gamma_k} = b_{\gamma_k} = 0$ are prescribed in advance (the law is non-informative). The presence of information a priori on the parameters most often accelerates convergence.

According to an embodiment of the invention, a law of probability a posteriori of $\gamma_k$ (resulting from the Gamma law a priori of adjustment parameters (

[Math. 124]

$a_{\gamma_k}$

[Math. 125]

$b_{\gamma_k}$), and from the law a priori of envelopes) is also a law Gamma

[Math. 126]

$\text{Gamma}(\tilde{a}_{\gamma_k}, \tilde{b}_{\gamma_k})$ having

[Math. 127]

$\tilde{a}_{\gamma_k}$ as first adjustment and

[Math. 128]

$\tilde{b}_{\gamma_k}$ as second adjustment, for example according to the following equation:

[Math. 129]

$\forall k \in \{1, \ldots, K\}$ $\gamma_k | a_k \sim \text{Gamma}(\tilde{a}_{\gamma_k}, \tilde{b}_{\gamma_k})$  [Math. 130]

In the above, $\tilde{a}_{\gamma_k} = a_{\gamma_k} + N$  [Math. 131]

$\tilde{b}_{\gamma_k} = b_{\gamma_k} + \dfrac{1}{2} \|A_p a_k\|^2$  [Math. 132]

According to an embodiment of the invention, a law a posteriori of the sinusoidal components of interest $a_k(n)\exp(j\Phi_k(n))$ is calculated during the first step C1 by the calculation module 12 from of the law of observation of the noise b (n) and from the law of observation of the measurement signal y(t). According to an embodiment of the invention, the law a posteriori of the real part $a^R$ of the sinusoidal components of interest $a_k(n)\exp(j\Phi_k(n))$ is defined by a model having a distribution of probability of Gaussian type $N(m_x^R, \Sigma_x)$ of average $m_x^R$ (real part of $m_x$) and of variance $\Sigma_x$, according to the following equation:

[Math. 133]

$a^r | y, d, \gamma_1, \ldots, \gamma_K \sim n(m_x^R, \Sigma_x)$

According to an embodiment of the invention, the law a posteriori of the imaginary part $a^I$ of the sinusoidal components of interest $a_k(n)\exp(j\Phi_k(n))$ is defined during the first step C1 by a model having a distribution of probability of Gaussian type $N(m_x^I, \Sigma_x)$ of average $m_x^I$ (imaginary part of $m_x$) and of variance $\Sigma_x$, for example according to the following equation:

[Math. 134]

$a^I | y, d, \gamma_1, \ldots, \gamma_K \sim N(m_x^I, \Sigma_x)$

The real part $a^R$ of the sinusoidal components of interest $a_k(n)\exp(j\Phi_k(n))$ and the imaginary part $a^I$ of the sinusoidal components of interest $a_k(n)\exp(j\Phi P_k(n))$ can be updated independently during the first step C1. In the case of a very large number of components to be estimated, this first step C1 can be done in parallel because of multi-processor architecture of the module 12.

In the above, $$m_x = \sum_k C^\top \sum_{j=1}^J S_j^\top \mathrm{diag}(d_j)^{-1} S_j y \qquad [\text{Math. 135}]$$

$$\sum_x = \left( C^\top \sum_{j=1}^J S_j^\top \mathrm{diag}(d_j)^{-1} S_j C + A^T \mathrm{diag}(\gamma_k) A \right)^{-1} \qquad [\text{Math. 136}]$$

diag($d_j$) is a matrix whereof the diagonal is formed by the coefficients $d_j$ and whereof the other coefficients are zero, diag($\gamma_k$) is a matrix whereof the diagonal is formed by the coefficients $\gamma_k$ and whereof the other coefficients are zero, $A_p$ is the matrix of the discrete differences $\nabla^p$ of order p of diag($\gamma_k$), A is the diagonal block matrix formed by the K matrices $A_p$ and is the matrix containing K blocks of $A_p$.

the matrix C is the diagonal matrix formed by the terms $\exp(j\Phi_k(n))$ for n ranging from 1 to N.

Auxiliary Decoupling Variable v of the Envelopes

According to an embodiment of the invention, during the sixth step C3 (following the second step C21 of the respective iteration carried out and/or at the fifth step C22 and prior to the third step C4) an auxiliary decoupling variable v of the complex envelopes $a_k(n)$ of the components between them in the model is calculated by the calculation module 12, from the updated complex envelopes $a_k(n)$, from the first parameters (which can be one or more or all of the $\tau_j$ for j ranging from 1 to J, and/or one or more or all of the $\beta_j$ for j ranging from 1 to J, and/or one or more or all of the $\eta_j$ for j ranging from 1 to J, and/or one or more or all of the $\zeta_j$ for j ranging from 1 to J) and from the second regularisation parameters $\gamma_k$. A known problem of optimisation algorithms is the inversion of a full matrix of large dimension, most often badly conditioned. This embodiment resolves this problem by decoupling the components by addition of the auxiliary variable v. The auxiliary variable v takes into account information on the correlations between the components $a_k(n)$. Due to the auxiliary variable v, the components are estimated independently. Coupling occurs implicitly via the auxiliary variable.

This embodiment resolves the large-dimension digital problem, linked to the above first problem. This embodiment is adapted all the more since a large number K of components is preferred. In fact, the known Vold-Kalman method suffers from the problem of large-dimension matrix inversion above all when the matrix in question is very badly conditioned which is the case for very large values of $r_k$. This inversion could occur in the known Vold-Kalman method due to an iterative algorithm of conjugated gradient type. This embodiment is not contradicted by this digital problem, given that the different components are decoupled in the algorithm and therefore can be estimated disjointly. The coupling between the different components is considered implicitly by the auxiliary variable v added in the updating of each component.

This embodiment of the invention on the auxiliary decoupling variable v can be realised by one of the other embodiments described hereinbelow.

According to an embodiment of the invention, the law of the auxiliary decoupling variable v is defined by a model having a distribution of probability of complex circularly symmetrical normal law type CNC($m_v$, $\Sigma_v$) having the average $m_v$ and the variance $\Sigma_v$. For v there is a conditional law

[Math. 137]

$$v|a,d \sim CNC(m_v, \Sigma_v)$$

The complex circularly symmetrical normal law CNC ($m_v$, $\Sigma_v$) has the average $$\begin{pmatrix} m_v^R \\ m_v^I \end{pmatrix} \qquad [\text{Math. 138}]$$

and covariance matrix $$\frac{1}{2}\begin{pmatrix} \Sigma_v^R & -\Sigma_v^I \\ \Sigma_v^I & \Sigma_v^R \end{pmatrix} \qquad [\text{Math. 139}]$$

and is defined by $$v \sim CNC\left(m_v, \sum_v\right) <=> \begin{pmatrix} v^R \\ v^I \end{pmatrix} \sim N\left(\begin{pmatrix} m_v^R \\ m_v^I \end{pmatrix}, \frac{1}{2}\begin{pmatrix} \Sigma_v^R & -\Sigma_v^I \\ \Sigma_v^I & \Sigma_v^R \end{pmatrix}\right) \qquad [\text{Math. 140}]$$

In the above, $$m_v = \sum_v a \qquad [\text{Math. 141}]$$

$$\sum_v = \frac{1}{\mu}Id - C^\top \sum_{j=1}^J S_j^\top \mathrm{diag}(d_j)^{-1} S_j C \qquad [\text{Math. 142}]$$

with µ being a real prescribed non-zero verifying $$\mu < \frac{1}{K\max(d_j(n))} \qquad [\text{Math. 143}]$$

This enables to eliminate problems of inversion of large-dimension matrices in particular for large values of N and K and allows an increase in data, which allows decoupling between the different components $a_k$ (n)exp($j\Phi_k$ (n)).

Calculation of the Sinusoidal Components $a_k$ of Interest During the First Step C1

According to an embodiment of the invention, the law a posteriori of the real part $a_k^R$ of the sinusoidal components of interest $a_k$ (n)exp($j\Phi_k$ (n)) is defined by a model having a distribution of probability of normal law type having the average $m_k^R$ and the variance $\Sigma_k$, for example according to the following equation:

[Math. 144]

$$\forall k \in \{1, \ldots, K\}\, a_k^R | y, d, \gamma_k, v_k \sim N(m_k^R, \Sigma_k)$$

According to an embodiment of the invention, the law a posteriori of the imaginary part $a_k^I$ of the sinusoidal components of interest $a_k(n)\exp(j\Phi_k(n))$ is defined by a model having a distribution of probability of normal law type having the average $m_k^I$ and the variance $\Sigma_k$, for example according to the following equation:

[Math. 145]

$$\forall k \in \{1, \ldots, K\} a_k^I | y, d, \gamma_k, v_k \sim N(m_k^I, \Sigma_k)$$

The definitions hereinabove of $a_k^R$ and of $a_k^I$ are laws a posteriori of the components.

In the above, $$m_k = \sum_k \left( C_k^T \sum_{j=1}^{J} S_j^T \mathrm{diag}(d_j)^{-1} S_j y + v_k \right) \quad \text{[Math. 146]}$$

$$\Sigma_k = \left( \frac{1}{\mu} \mathrm{Id} + \gamma_k A_p^T A_p \right)^{-1} \quad \text{[Math. 147]}$$

Therefore, $a_k^R$ and $a_k^I$ can be estimated independently. The coupling is considered only via the auxiliary variable $v$ occurring in the average $m_k$. It is interesting to note that even if there is a need to make the inversion here, this operation is less expensive. On the one hand, the dimension of the matrix $\Sigma_k$ is K times smaller than the matrix $\Sigma_x$. On the other hand, if the choice is made for conditions of circulating edges (or zero edges by making padding in the zero edges) in the matrix of differences $A_p$, the matrix $\Sigma_k$ is then circulating and therefore diagonalisable in the Fourier field.

According to an embodiment of the invention, $$\Sigma_k = F_N^T \left( \frac{1}{\mu} \mathrm{Id} + \gamma_k Q_k^T Q_k \right)^{-1} F_N \quad \text{[Math. 148]}$$

where $Q_k$ is the diagonal matrix containing the Fourier coefficients of the filter associated with the discrete matrix of difference $A_p$ which is equal to the first column of $A_p$. Updating of each $m_k$ can also be done by shifting to the Fourier field. Also, there is no need to store $\Sigma_k$, or its inverse, but simply the diagonal values of the matrix $$\frac{1}{\mu} \mathrm{Id} + \gamma_k Q_k^T Q_k \quad \text{[Math. 149]}$$

According to an embodiment of the invention, the calculation module 12 is configured to perform a seventh decision step E following the fourth step D. According to an embodiment of the invention, the decision during the seventh step E is taken automatically by the calculation module 12 from analyses carried out automatically by the calculation module 12 on the extracted components $a_k(n)$ having been obtained at the fourth step D, and/or from test bench vibratory characterisation (for example identification of eigen modes) carried out by the calculation module 12 on the extracted components $a_k(n)$ having been obtained at the fourth step D of the rotating machine 100. According to an embodiment of the invention, the seventh step E is performed by the calculation module 12 on a monitoring decision and/or on the triggering of an alarm AL or alert AL of defects of the rotating machine 100 (for example: imbalance, meshing, misalignment, mass eccentricity, worn bearings, twisted shafts, misaligned shafts, parallel alignment defect of a rotor shaft of the rotating machine, broken shaft, premature wear of bearings, joints, shafts and couplings of the kinematic chain, resonance). According to an embodiment of the invention, the monitoring device 1 is embedded on the aircraft. According to an embodiment of the invention, the calculation module 12 automatically controls communication of the alert, of the alarm AL or of the decision it has taken at the seventh step E on the physical outlet SP, for example on the display screen, and/or at a fixed ground station SP.

Updating of the law in the proposed device can be done in two ways.

On the one hand, it can be approximated by samples. This concerns the Monte Carlo Markov Chain methods (MCMC). Therefore, updating a law means taking a sample of this law. It is noted that all laws are simple to sample. For the parameters of the law of observation and of the regularisation parameter, this is evident. For the law a posteriori of the envelopes, the generation of random variables can be done by shifting to the Fourier field. And given the particular form of $\Sigma_y$, the generation of random auxiliary variables can also be done directly based on the fact that $CC^T = K$. Id and $S_j S_j^T = \mathrm{Id}$. After enough iterations, the random variables generated by the algorithm will follow the preferred laws a posteriori; therefore the statistics (average, variance etc) can be approximated by using empirical estimators with these samples.

On the other hand, the law a posteriori can be approximated by another simpler one, for example by a Bayesian-Variational (ABV). approximation approach. In this way the statistics of laws of interest can be approximated by those of approximating laws after enough iterations.

An example of application of the invention on a vibratory signal of a helicopter is given hereinbelow in FIGS. 4a to 4f. The aim is to monitor the component $N_2$ of the vibratory signal y(t) of the high-pressure shaft of a turbomachine 100, for example of the shaft of the free turbine in the helicopter engine.

FIG. 4a shows the spectrogram of the measured signal y(t) by indicating, for each instant in abscissae and each frequency on the frequency band [0,700] Hz in ordinates, a pixel whereof the greyscale corresponds according to the right-hand scale of values ECH to a spectral amplitude for this frequency (and similarly for the spectrograms of FIGS. 4c, 4d, 4e and 4f). FIG. 4b shows in ordinates the amplitude of the envelope $a_k(n)$ having been calculated according to the invention as a function of time in abscissae (noise is considered non-stationary and non-Gaussian and the regularisation parameter is estimated automatically). FIG. 4b shows a significant rise in amplitude from the instant 5s, which is the sign of a passage through a resonance. The evaluation of the maximal amplitude during this resonance is highly important practically for vibratory control of the aircraft in transient operation. FIG. 4c shows the spectrogram of the residual signal (the measured signal y(t) from which the component $N_2$ is subtracted). FIG. 4c shows that the component $N_2$ of interest has been correctly estimated. FIGS. 4d, 4e and 4f show the spectrograms of the residual signal by using the known method Vold-Kalman with different regularisation parameters adjusted manually (these are values currently used in literature). FIG. 4d shows an underestimation of the amplitude of the component $N_2$ of interest when passing through resonance for a large value of $r_k$ (the estimated amplitude of the component $N_2$ of interest is less important than the real one, the estimated envelope is very smoothed excessively, which very aggressively penalises the great variations of the envelope). FIGS. 4e and 4f show that there is overestimation of the amplitude of the component $N_2$ of interest, for a small value of $r_k$ (the estimated amplitude of the component $N_2$ of interest is more important than the real amplitude, the estimated envelope is very affected by noise). In fact, the component $N_2$ of interest having been estimated in FIGS. 4e and 4f is badly filtered and contains much background noise. Also, overestimation of the envelope can result from a badly conditioned matrix and therefore from digital problems (see FIGS. 1 and 4f for example).

According to another embodiment, $\beta_j$ is equal to zero. In this case the contribution of the narrowband noise e(n) is omitted. The principal advantage is the reduction in the number of parameters to be estimated ($\beta_j$ and $\zeta_j$) as well as the calculation cost. Admittedly, this can be a good approximation if no parasite harmonic of the residual signal interferes directly with the signals of interest. This goes back to y|a, τ~NC (Ca,2τ$^{-1}$)

In this particular case, the advantage relative to the known Vold-Kalman method is the automatic adjusting of the regularisation parameter $\gamma_k$. In fact, the Vold-Kalman parameter $r_k$ is linked to the parameters of the invention by $r_k = \gamma_k/\tau$.

A disadvantage of this approximation could manifest, for example, in the presence of interception between the harmonics of interest and the residual harmonics. In fact, estimation artefacts can occur at instants of interferences.

However, if the instants of interferences are known approximately (for example with inspection of the spectrogram), it can be assumed that the noise is Gaussian except for close to coupling, that is at intervals j ∈{1, . . . , J} containing the coupling instants. This means imposing $\beta_j=0$ in the other intervals not containing the coupling moments.

Of course, the embodiments, characteristics, possibilities and examples described hereinabove can be combined with each other or be selected independently of each other.

If a parsimonious model other than the Bernoulli-Gaussian model is used, the same forms of laws are obtained. In this case, the parameters of the noise models are going to change. The law of the envelopes, of the regularisation parameters and the auxiliary variable will have the same form. The chosen noise model will act only on the values of $d_j$.

The invention claimed is:

1. A method for monitoring at least one rotating machine of an aircraft, the mehod comprising the following steps:
    acquiring at least one measurement signal of the rotating machine by an acquisition module,
    estimating instantaneous frequencies of sinusoidal components of the at least one measurement signal by an estimation module,
    executing by a calculation module several successive iterations, each of which comprising:
        updating complex envelopes of the sinusoidal components,
        updating parameters of a noise model of the at least one measurement signal from the complex envelopes having been updated,
        performing a convergence test as to whether the noise model converges from the preceding iteration to the current iteration, to:
            in the negative, redo a new iteration,
            in the affirmative, perform a calculation of the complex envelopes from the iterations carried out,
    updating at each iteration regularisation parameters of the noise model by the calculation module from the complex envelopes having been updated,
    and, updating, at each iteration, an auxiliary decoupling variable of the complex envelopes of the components between them in the noise model by the calculation module from the complex envelopes having been updated and from the parameters of the noise model having been updated.

2. The method according to claim 1, wherein the noise model of the at least one measurement signal comprises a structured interfering noise, whereof a distribution of probability a priori of its spectrum has a heavy-tailed law calculated by the calculation module at each iteration.

3. The method according to claim 1, wherein the noise model of the at least one measurement signal comprises a non-structured interfering noise, whereof a distribution of probability a priori is given by a third distribution of Gaussian type calculated by the calculation module at each iteration.

4. The method according to claim 1, wherein the noise model of the at least one measurement signal resulting from a structured interfering noise model and from a non-structured interfering noise model is a convolution of a Gaussian law and of a heavy-tailed law whose parameters are calculated by the calculation module at each iteration.

5. The method according to claim 1, wherein a conjugated law of probability a priori is allocated to hyperparameters of laws a priori of the parameters of the noise model.

6. The method according to claim 1, wherein a Gamma law of probability a priori is allocated to at least one of the regularisation parameters and results from a Gamma law a posteriori whose parameters are calculated by the calculation module at each iteration.

7. The method according to claim 1, wherein the auxiliary decoupling variable is defined by a model having a distribution of probability of a type of circularly symmetrical normal complex law, which is calculated by the calculation module at each iteration.

8. The method according to claim 1, wherein the convergence test comprises testing by the calculation module at each current iteration that the difference between an absolute value of the complex envelope calculated from the current iteration and the absolute value of the complex envelope calculated from the preceding iteration is less than a prescribed threshold.

9. The method according to claim 1, comprising analysing by the calculation module the complex envelopes having been calculated, and triggering a communication of an alarm by the calculation module on at least one physical outlet as a function of the complex envelopes having been analysed.

10. A computer program comprising code instructions for executing the monitoring method according to claim 1, when it is executed on a computer.

11. A monitoring device of at least one rotating machine of an aircraft, the device comprising
    a module for acquiring at least one measurement signal of the rotating machine,
    wherein the device comprises
    a module for estimating instantaneous frequencies of sinusoidal components of the at least one measurement signal,
    a calculation module configured, at each of several successive iterations carried out, to:
        update complex envelopes of the sinusoidal components,
        update parameters of a noise model of the at least one measurement signal from the complex envelopes having been updated,
        test whether the noise model converges from the preceding iteration to the current iteration, to:
            in the negative, redo a new iteration, in the affirmative, perform a calculation of the complex envelopes from the iterations carried out, the calculation module being configured to, at each of the successive iterations carried out:

update regularisation parameters of the noise model from the complex envelopes having been updated, update an auxiliary decoupling variable of the complex envelopes of the components between them in the noise model, from the complex envelopes having been updated and from the parameters of the noise model having been updated.

12. The monitoring device according to claim 11, wherein the calculation module is configured to analyse the complex envelopes having been calculated, and is able to trigger a communication of an alarm on at least one physical outlet of the device as a function of the complex envelopes having been analysed.

13. The monitoring device according to claim 11, wherein the auxiliary decoupling variable is defined by a model having a distribution of probability of a type of circularly symmetrical normal complex law, which is calculated by the calculation module at each iteration.

14. An aircraft comprising at least one rotating machine and a monitoring device of the at least one rotating machine according to claim 11.

* * * * *